(12) United States Patent
Watanabe

(10) Patent No.: US 11,799,472 B2
(45) Date of Patent: Oct. 24, 2023

(54) DRIVE CIRCUIT

(71) Applicant: DENSO CORPORATION, Kariya (JP)

(72) Inventor: Kazunori Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 131 days.

(21) Appl. No.: 17/497,307

(22) Filed: Oct. 8, 2021

(65) Prior Publication Data

US 2022/0029620 A1    Jan. 27, 2022

Related U.S. Application Data

(63) Continuation of application No. PCT/JP2020/013594, filed on Mar. 26, 2020.

(30) Foreign Application Priority Data

Apr. 25, 2019 (JP) .................. 2019-084497

(51) Int. Cl.
*H03K 17/16* (2006.01)
*H02M 1/08* (2006.01)
*H02M 7/5387* (2007.01)
*H02P 27/08* (2006.01)

(52) U.S. Cl.
CPC ............ *H03K 17/166* (2013.01); *H02M 1/08* (2013.01); *H02M 7/53871* (2013.01); *H02P 27/08* (2013.01)

(58) Field of Classification Search
CPC .......... H03K 17/166; H03K 2017/066; H03K 17/063; H02M 1/08; H02M 7/53871; H02M 1/0029; H02M 1/0038; H02M 1/0048; H02M 1/0058; H02P 27/08; Y02B 70/10
See application file for complete search history.

(56) References Cited

U.S. PATENT DOCUMENTS

2016/0218612 A1    7/2016   Morimoto
2019/0020263 A1*   1/2019   Hiranuma ......... H02M 7/53875

* cited by examiner

*Primary Examiner* — Jung Kim
(74) *Attorney, Agent, or Firm* — Oliff PLC

(57) ABSTRACT

A drive circuit for a switching element includes: a first power supply; a second power supply; a power supply switching unit that switches the first and second power supplies for applying the drive voltage based on a drive command; and an output switching unit outputting an output voltage switching signal to the second power supply that the output voltage of the second power supply becomes zero in a part of a drive period of the switching element including at least a part of an on-drive period, and the output voltage becomes a predetermined voltage other than zero in a remaining part of the drive period including at least a part of an off-drive period.

10 Claims, 16 Drawing Sheets

DRIVE CIRCUIT

CROSS REFERENCE TO RELATED APPLICATION

The present application is a continuation application of International Patent Application No. PCT/JP2020/013594 filed on Mar. 26, 2020, which designated the U.S. and claims the benefit of priority from Japanese Patent Application No. 2019-084497 filed on Apr. 25, 2019. The entire disclosures of all of the above applications are incorporated herein by reference.

TECHNICAL FIELD

The present disclosure relates to a drive circuit for a switching element.

BACKGROUND

The drive circuit according to a conceivable technique includes a positive power supply and a negative power supply. The connection points of the two power supplies are connected to the main electrode on the low potential side of the switching element, specifically, the source of the MOSFET. The negative electrode of the positive power supply and the positive electrode of the negative power supply are connected to the source.

SUMMARY

According to an example, a drive circuit for a switching element includes: a first power supply; a second power supply; a power supply switching unit that switches the first and second power supplies for applying the drive voltage based on a drive command; and an output switching unit outputting an output voltage switching signal to the second power supply that the output voltage of the second power supply becomes zero in a part of a drive period of the switching element including at least a part of an on-drive period, and the output voltage becomes a predetermined voltage other than zero in a remaining part of the drive period including at least a part of an off-drive period.

BRIEF DESCRIPTION OF THE DRAWINGS

The above and other objects, features and advantages of the present disclosure will become more apparent from the following detailed description made with reference to the accompanying drawings. In the drawings:

FIG. 2 is a diagram for explaining a false turn-on;

FIG. 5 is a diagram showing a current flow at the time of turn-on;

DETAILED DESCRIPTION

Figure 1:
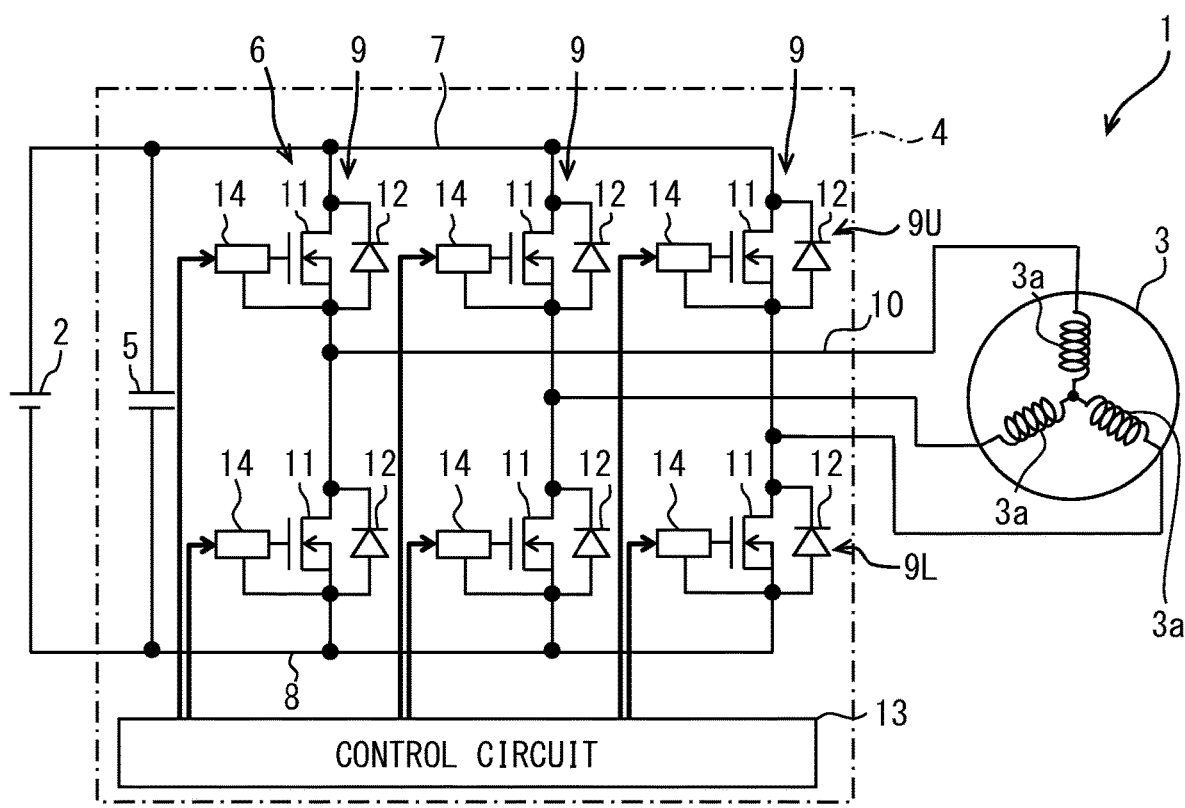
FIG. 1 is a diagram illustrating a circuit configuration of a power converter device to which a drive circuit according to a first embodiment is applied.

According to the conceivable technique, when the MOSFET turns off, a negative voltage can be applied to the gate since a negative power source is located in the path between the source and the gate. On the other hand, when the MOSFET turns on, a positive voltage can be applied to the gate since the positive power supply is located in the path between the source and the gate.

In the conceivable technique, two power supplies are arranged in series. When the output voltage of the negative power supply increases to suppress a false turn-on, the output voltage of the positive power supply is reduced by that amount, and the loss during the on-drive period is increased. On the other hand, when the output voltage of the positive power supply is increased to reduce the loss, the output voltage of the negative power supply is reduced by that amount, and the false turn-on is likely to occur.

The false turn-on is a phenomenon in which the switching element is turned on unintentionally because the gate is charged with a charge through the feedback capacitance between the main electrode on the high potential side and the gate due to a steep potential fluctuation of the main electrode on the high potential side due to noise or the like. For example, in a configuration in which a switching element forms one arm of an upper and lower arm circuit, there may be a possibility that a false turn-on may occur due to noise when a switching element of another arm (e.g., an opposite arm) is turned on. In particular, in the case of a wide bandgap semiconductor, since the gate threshold voltage (Vth) is low, the false turn-on may be likely to occur. By applying a negative voltage, the margin until the gate voltage reaches the gate threshold voltage (Vth) becomes large, so that the false turn-on can be suppressed.

In view of the above points, a drive circuit is provided to be capable of reducing loss during the on-drive period while suppressing the false turn-on.

The drive circuit of the switching element disclosed here includes a first power supply, a second power supply, a power supply switching unit, and an output switching unit.

The negative electrodes of the first power supply and the second power supply are connected to each other. The positive electrode of the second power supply is connected to the main electrode on the low potential side of the switching element. The output voltage of the second power supply is variable within a voltage range smaller than that of the first power supply.

In the power supply switching unit, when the switching element is driven off, the second power supply is located in the path between the main electrode on the low potential side and the gate, and when the switching element is driven on, the power supply which applies the drive voltage based on the drive command is switched so that the first power supply and the second power supply are located in the path for applying the positive voltage to the gate.

Then, the output switching unit outputs the output voltage switching signal to the second power supply so that the output voltage of the second power supply becomes zero in a part of the drive period of the switching element including at least a part of the on-drive period, and the output voltage becomes a predetermined voltage other than zero in the remaining part of the drive period including at least a part of the off-drive period.

According to the disclosed drive circuit, the negative electrode of the second power supply is connected to the negative electrode of the first power supply, and the positive electrode of the second power supply is connected to the main electrode on the low potential side. The first power supply is connected to the main electrode on the low potential side via the second power supply. By locating the first power supply and the second power supply in the path between the main electrode on the low potential side and the gate, a positive voltage can be applied to the gate, whereby the switching element can be driven on. Since the output voltage of the second power supply is set to zero during the period in which the switching element is driven on, the drive voltage (that is the positive voltage) can be increased as compared with the case where the output voltage is set to a predetermined voltage other than zero. Therefore, the loss during the on-drive period, for example, the switching loss and the DC loss can be reduced.

When the switching element is driven off, the second power supply is located in the path. In the second power supply, the positive electrode is connected to the main electrode on the low potential side. Then, during the period in which the switching element is driven off, the output voltage of the second power supply is set to a predetermined voltage. Therefore, a negative voltage can be applied to the gate to suppress the false turn-on. As a result, it is possible to provide a drive circuit capable of reducing the loss during the on-drive period while suppressing the false turn-on.

Multiple embodiments will be described with reference to the drawings. In the multiple embodiments, functionally and/or structurally corresponding portions are designated with the same reference numerals. The power conversion device shown below is applicable to vehicles, such as an electric vehicle (EV) and a hybrid vehicle (HV), for example.

First Embodiment

First, a schematic configuration of a vehicle drive system to which a power converter device is applied will be described with reference to FIG. 1.

<Vehicle Drive System>

As shown in FIG. 1, a vehicle drive system 1 is provided with a DC power supply 2, a motor generator 3, and a power converter device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotating electric machine. The motor generator 3 functions as a vehicle driving power source, that is, an electric motor. The motor generator 3 functions also as a generator during regeneration. The power converter device 4 performs electric power conversion between the DC power supply 2 and the motor generator 3.

<Circuit Configuration of Power Converter Device>

Next, a circuit configuration of the power converter device 4 will be described with reference to FIG. 1. The power converter device 4 includes at least a power conversion unit. The power converter device 4 of the present embodiment includes a smoothing capacitor 5, an inverter 6 which is a power conversion unit, a control circuit 13, and a drive circuit 14.

The smoothing capacitor 5 is connected between the P line 7 which is the power line on the high potential side and the N line 8 which is the power line on the low potential side. The P line 7 is connected to the positive electrode of the DC power supply 2, and the N line 8 is connected to the negative electrode of the DC power supply 2. The smoothing capacitor 5 mainly smoothes the DC voltage supplied from the DC power supply 2.

The inverter 6 is a DC-AC converter. The inverter 6 includes upper-lower arm circuits 9 for three phases. The connection point of each upper and lower arm circuit 9 is connected to the corresponding phase winding 3a via the output line 10. The upper and lower arm circuit 9 has an upper arm 9U and a lower arm 9L. The upper arm 9U and the lower arm 9L are connected in series between the P line 7 and the N line 8 with defining the upper arm 9U as the P line 7 side. The inverter 6 has six arms.

Each arm has a MOSFET 11 as a switching element and a diode 12. The diode 12 is connected in anti-parallel (i.e., reversely) to the MOSFET 11 for reflux. The diode 12 may be a parasitic diode (i.e., a body diode) of the MOSFET 11 or may be provided separately from the parasitic diode. The MOSFET 11 and the diode 12 are formed on a semiconductor substrate.

In the present embodiment, the MOSFET 11 is an n-channel type. In the MOSFET 11, the drain is the main electrode on the high potential side, and the source is the main electrode on the low potential side. The MOSFET 11 is formed on a semiconductor substrate having a wide bandgap. Wide bandgap semiconductors have a larger bandgap than Si (silicon). Examples of wide bandgap semiconductors include SiC (silicon carbide), GaN (gallium nitride), and diamond. The MOSFET 11 of this embodiment is formed on a SiC substrate.

In the upper arm 9U, the drain is connected to the P line 7. In the lower arm 9L, the source is connected to the N line 8. The source on the upper arm 9U side and the drain on the lower arm 9L side are connected to each other. The anode of the diode 12 is connected to the source of the corresponding MOSFET 11, and the cathode is connected to the drain.

The inverter 6 converts the DC voltage into a three-phase AC voltage according to the switching control by the control circuit 13 and outputs the three-phase AC voltage to the motor generator 3. Thereby, the motor generator 3 is driven to generate a predetermined torque. At the time of regenerative braking of the vehicle, the inverter 6 converts the three-phase AC voltage generated by the motor generator 3 by receiving the rotational force from the wheels into a DC voltage according to the switching control by the control circuit 13, and outputs the DC voltage to the P line 7. In this way, the inverter 6 performs bidirectional power conversion between the DC power supply 2 and the motor generator 3.

The control circuit 13 generates a drive command for operating the MOSFET 11 and outputs the drive command to the drive circuit 14. The control circuit 13 generates the drive command based on a torque request input from a higher-level ECU (not shown) or signals detected by various sensors. Various sensors include, for example, a current sensor, a rotation angle sensor, and a voltage sensor. The current sensor detects the phase current flowing through the winding 3a of each phase. The rotation angle sensor detects the rotation angle of the rotor of the motor generator 3. The voltage sensor detects the voltage across the smoothing capacitor 5. The power converter device 4 includes these sensors (not shown). The control circuit 13 outputs a PWM signal as a drive command. The control circuit 13 includes, for example, a microcomputer (microcomputer). "ECU" is an abbreviation of "Electronic Control Unit". PWM is an abbreviation for Pulse Width Modulation.

The drive circuit 14 supplies a drive voltage to the gate of the MOSFET 11 of the corresponding arm based on the drive command of the control circuit 13. The drive circuit 14 drives the corresponding MOSFET 11 by applying a drive voltage to turn on and off the drive of the corresponding MOSFET 11. The drive circuit 14 is also defined as a driver. In the present embodiment, one drive circuit 14 is arranged for one arm.

The power converter device 4 may further include another converter as a power conversion unit. The converter is a DC-DC converter that converts a DC voltage into anther DC voltage having a different value. The converter is provided between the DC power supply 2 and the smoothing capacitor 5. The converter is configured to include, for example, a reactor and the above-mentioned upper and lower arm circuits 9. Further, a filter capacitor for removing power supply noise from the DC power supply 2 may be provided. The filter capacitor is provided between the DC power supply 2 and the converter.

The example in which the power conversion device 4 includes the control circuit 13 is shown, but the present embodiment may not be limited thereto. For example, by giving the function of the control circuit 13 to the upper ECU, the configuration may not include the control circuit 13. An example in which the drive circuit 14 is provided for each arm has been shown, but the present embodiment may not be limited to this. For example, one drive circuit 14 may be provided for one upper and lower arm circuit 9.

<False Turn-On>

Next, the false turn-on of the MOSFET 11 will be described with reference to FIG. 2. The false turn-on is sometimes referred to as self-turn-on.

Figure 2:
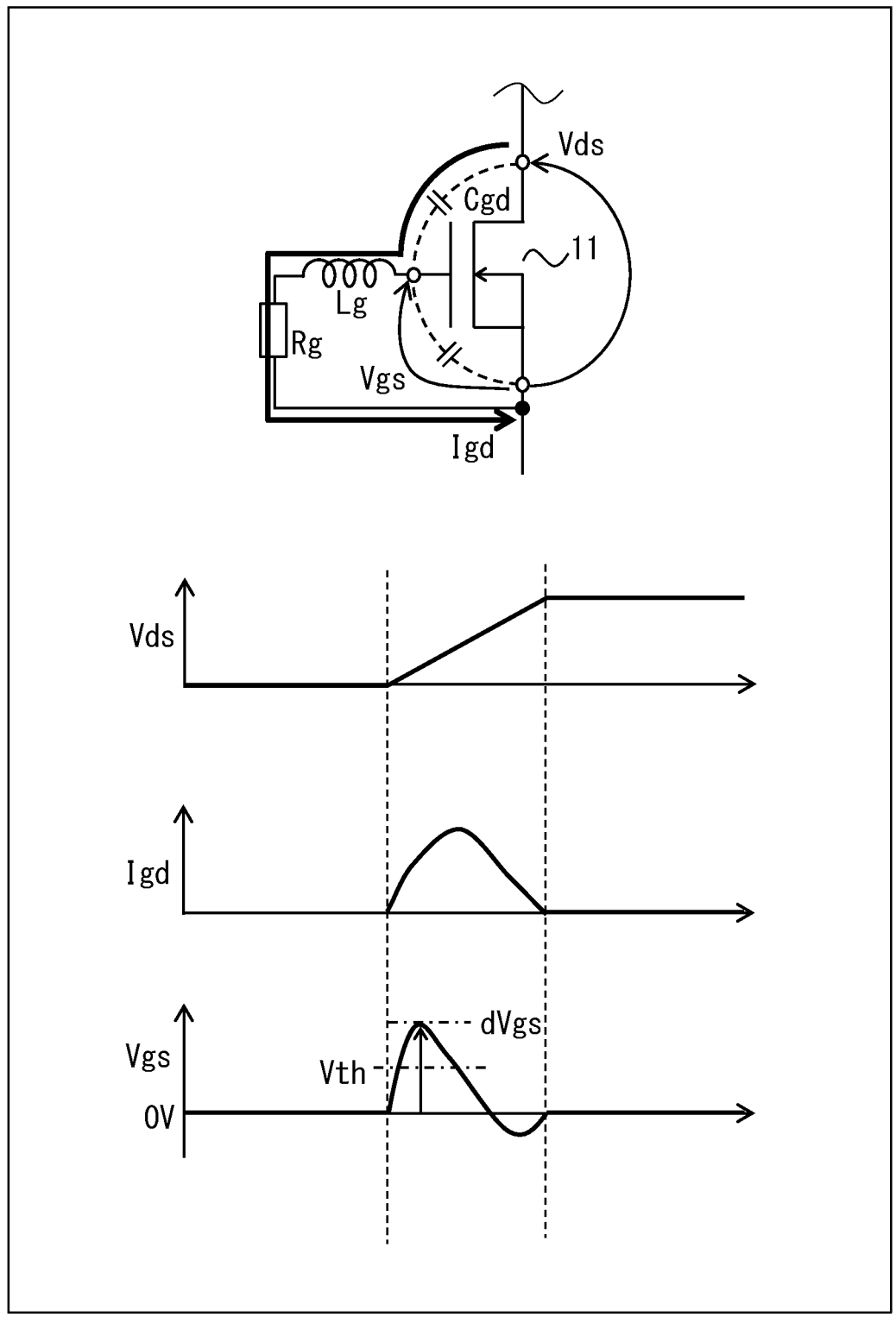

In FIG. 2, Vds indicates a drain potential based on the source potential as a standard voltage, that is, a drain voltage. Vgs indicates a gate potential based on the source potential as a standard voltage, that is, a gate voltage. Cgd indicates the feedback capacitance between the gate and the drain. Lg indicates the inductance of the gate wiring. Rg indicates the gate resistance.

The drain voltage Vds of the MOSFET 11 fluctuates sharply due to noise or the like. For example, in the upper and lower arm circuit 9, when the MOSFET 11 forming the upper arm 9U (i.e., the opposing arm) is turned on, the drain voltage Vds of the MOSFET 11 forming the lower arm 9L fluctuates sharply.

The current Igd flows due to a steep fluctuation (e.g., dVds/dt) of the drain voltage Vds. The current Igd flows through the feedback capacitance Cgd, as indicated by the solid arrow. The current Igd is represented by the following equation.

$$\text{Current } I_{gd} = C_{gd} \times dV_{ds}/dt \qquad \text{(Equation 1)}$$

Further, when the current Igd flows through the gate wiring, a large voltage (i.e., surge voltage) is generated at the gate. This voltage dVgs is represented by the following equation. The voltage dVgs is a change amount.

$$dV_{gs} = R_g \times i_{gd} + L_g \times di_{gd}/dt \qquad \text{(Equation 2)}$$

When the induced voltage dVgs exceeds the gate threshold voltage (Vth), the MOSFET 11 is erroneously turned on even though it is in the off drive period.

As described above, due to the steep potential fluctuation of the main electrode on the high potential side, the gate is charged with electric charge via the feedback capacitance, and the switching element may be unintentionally turned on.

<Loss During the Turn-on Period>

Next, the loss in the on-drive period of the MOSFET 11 will be described with reference to FIG. 3.

Figure 3:
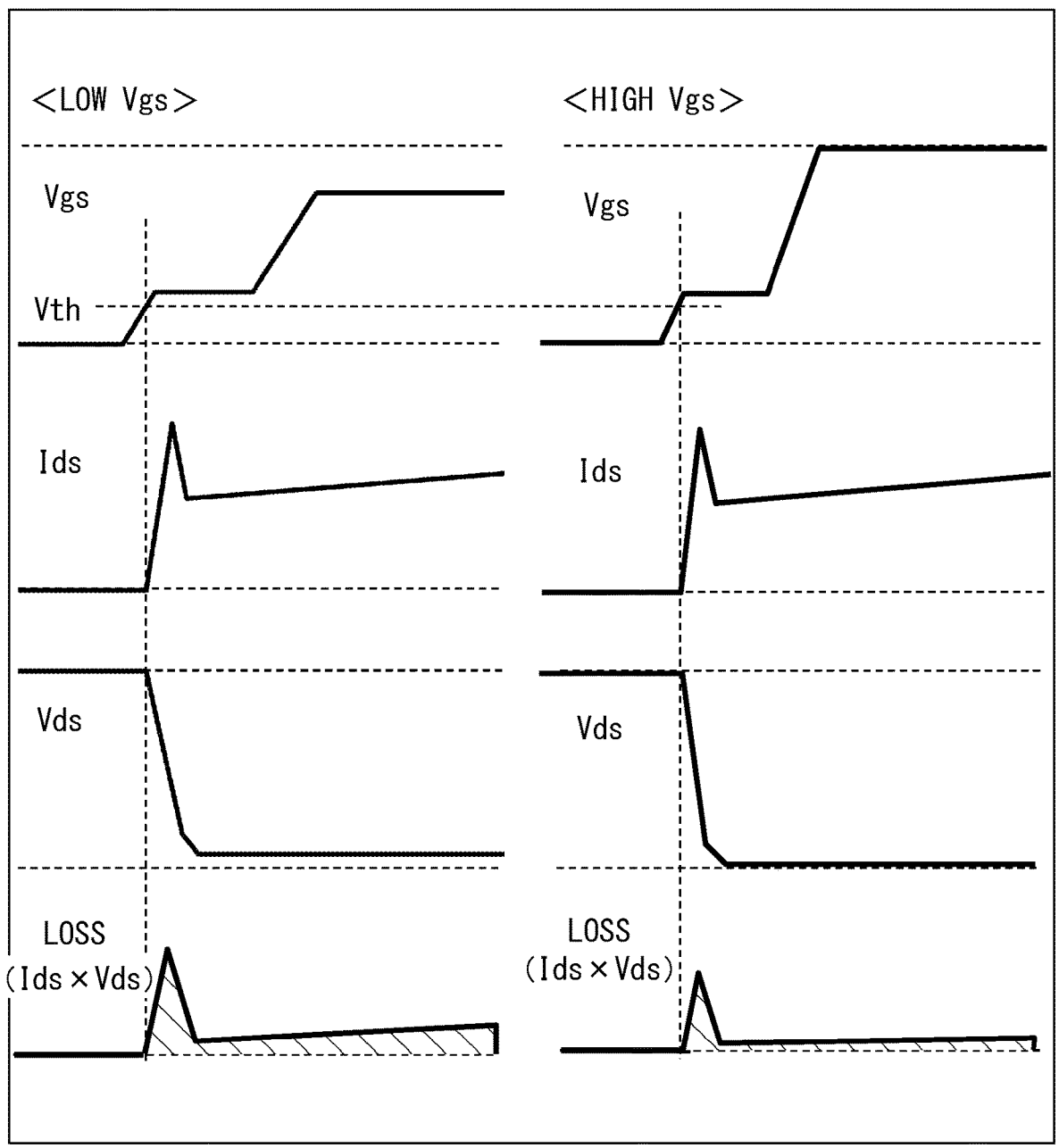
FIG. 3 is a diagram showing a relationship between a gate voltage Vgs and a loss.

FIG. 3 shows a signal waveform during the on-drive period including turn-on. FIG. 3 shows a case where the gate voltage Vgs is low and a case where the gate voltage Vgs is high. The drain current Ids is the current flowing between the drain and the source, and is sometimes referred to as the main current. When the gate voltage Vgs exceeds the gate threshold voltage Vth, the drain current Ids flows.

The loss is indicated by the product of the drain current Ids and the drain voltage Vds. When the gate voltage Vgs is high, switching (i.e., turn-on) becomes fast, and the drain voltage Vds drops quickly. Therefore, the switching loss can be reduced as compared with the case where the gate voltage Vgs is low.

When the gate voltage Vgs is high, the on-resistance becomes small. As a result, the drain voltage Vds during fixed on state (i.e., the full on state) becomes small. Therefore, the DC loss can be reduced as compared with the case where the gate voltage Vgs is low.

<Drive Circuit>

Figure 4:
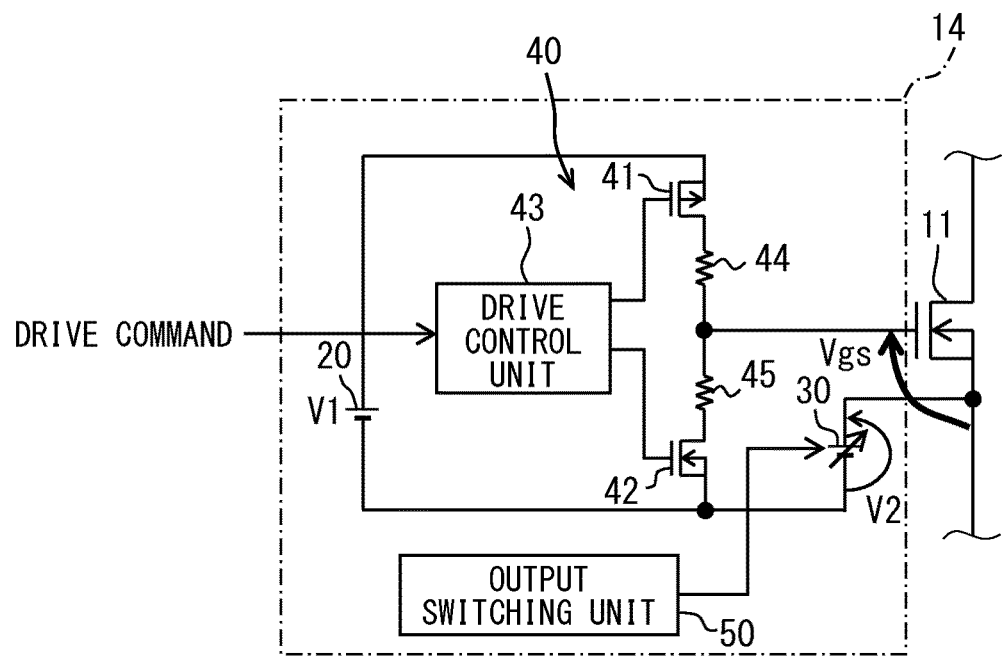
FIG. 4 is a diagram illustrating a drive circuit.
Figure 5:
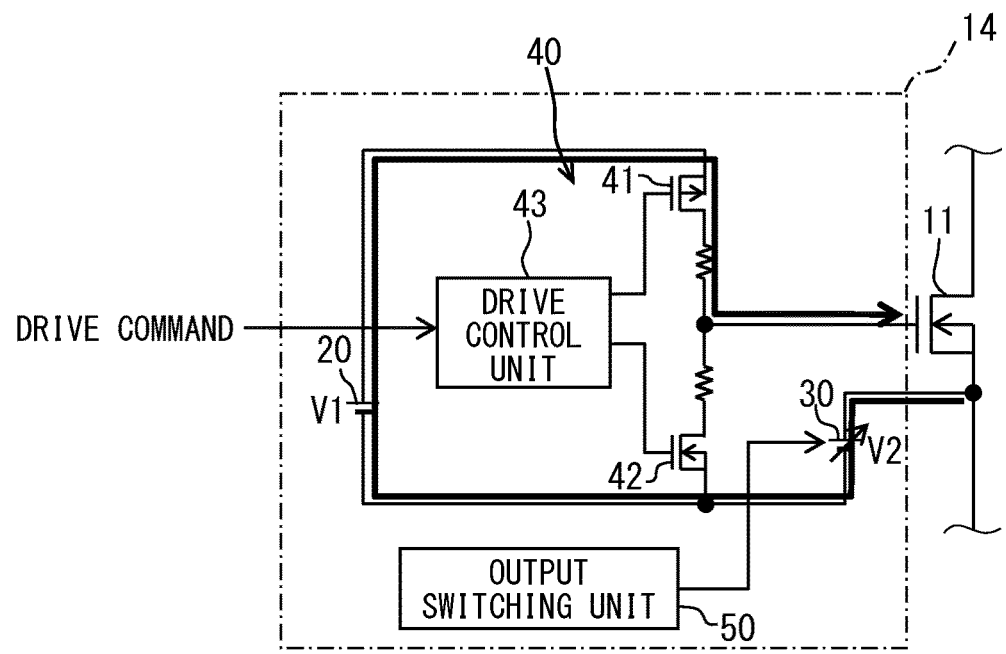
Figure 6:
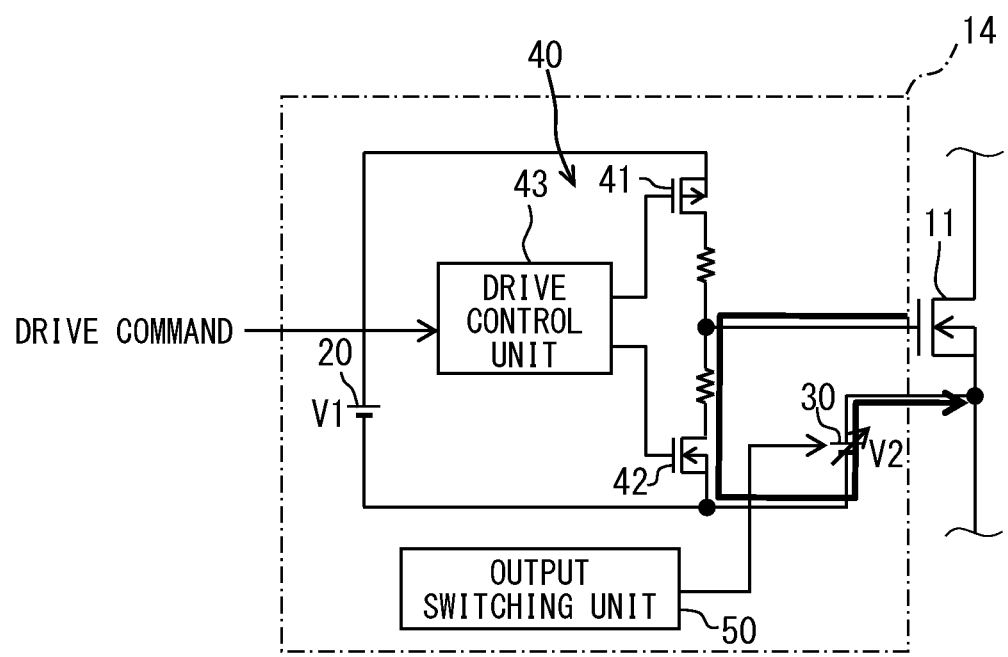
FIG. 6 is a diagram showing a current flow at the time of turn-off.
Figure 7:
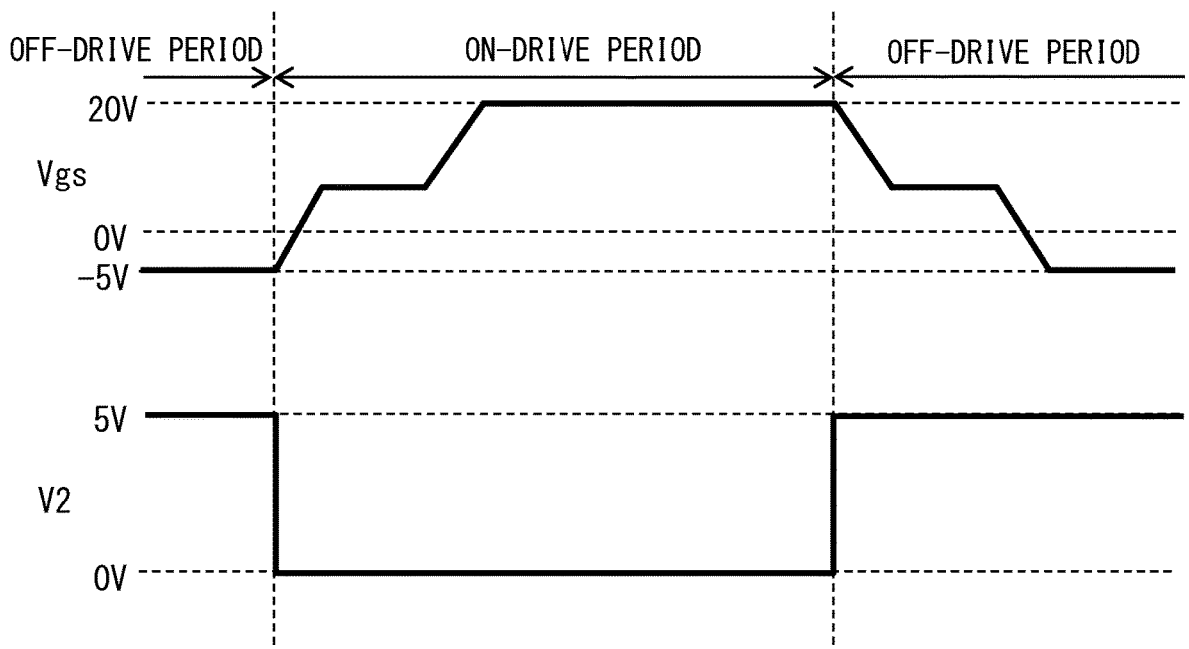
FIG. 7 is a timing chart showing an example of switching the output voltage V2.

Next, the drive circuit 14 will be described with reference to FIGS. 4 to 7. In FIG. 4, the diode 12 is not shown for convenience. FIG. 5 shows the current flow at turn-on. FIG. 6 shows the current flow at turn-off. FIG. 7 is a timing chart showing the gate voltage Vgs and the output voltage V2 of the second power supply 30.

As shown in FIG. 4, the drive circuit 14 includes a first power supply 20, a second power supply 30, a power supply switching unit 40, and an output switching unit 50.

The first power supply 20 is a constant voltage source having a fixed output voltage V1. In this embodiment, the output voltage V1 is 20V. The second power supply 30 is a power supply having a variable output voltage V2. The second power supply 30 makes the output voltage V2 variable within a voltage range smaller than the output voltage V1. The second power supply 30 sets the output voltage V2 according to the switching signal described later. In the present embodiment, the second power supply 30 can set the output voltage V2 within the range of 0 Volts to 5 Volts. The second power supply 30 is set to zero (i.e., 0 Volts) or 5 Volts according to the switching signal. The negative electrode of the second power source 30 is connected to the negative electrode of the first power source 20. The positive electrode of the second power source 30 is connected to the source of the MOSFET 11. In the following, the first power supply 20 and the second power supply 30 may be simply referred to as power supplies 20 and 30.

The power switching unit 40 is a circuit having an turn-on switch 41, a turn-off switch 42, and a drive control unit 43. The turn-on switch 41 is provided between the positive electrode of the first power supply 20 and the gate of the MOSFET 11. In the present embodiment, the on-state switch 41 is a p-channel MOSFET. The source of the turn-on switch 41 is connected to the positive electrode of the first power supply 20. The drain of the turn-o switch 41 is connected to the gate of the MOSFET 11 via the resistor 44. The turn-on switch 41 may be referred to as a charging switch.

The turn-off switch 42 is provided between the connection point of the power supplies 20 and 30 and the gate of the MOSFET 11. In the present embodiment, the turn-off switch 42 is a n-channel MOSFET. The source of the turn-off switch 42 is connected to the connection points of the power supplies 20 and 30. The drain of the turn-off switch 42 is connected to the gate of the MOSFET 11 via the resistor 45. The turn-off switch 42 may be referred to as a discharging switch. Hereinafter, the turn-on switch 41 and the turn-off switch 42 may be simply referred to as switches 41 and 42.

The switches 41 and 42 are connected in series between the positive electrode of the first power supply 20 and the connection point of the power supplies 20 and 30. The drains of the switches 41 and 42 are connected to each other. The gate of the MOSFET 11 is connected to the connection point between the switches 41 and 42. A resistor 44 is provided between the connection point of the switches 41 and 42 and the turn-on switch 41, and a resistor 45 is provided between the connection point and the turn-off switch 42.

A drive command is input from the control circuit 13 to the drive control unit 43 via an insulation element (not shown) such as a photocoupler. The drive control unit 43 controls to drive the switches 41 and 42 based on a drive command that is a PWM signal. The drive control unit 43 switches the power supply for supplying the drive voltage to the gate of the MOSFET 11 by turning on and off the switches 41 and 42. When one of the switches 41 and 42 is turned on, a path is formed between the source and the gate of the MOSFET 11. The power supply located in this path functions as a power supply for applying the drive voltage.

When the drive command is at the L (i.e., low) level, the drive control unit 43 turns on the turn-on switch 41 and turns off the turn-off switch 42. As a result, a first path is formed between the source of the MOSFET 11 and the gate via the on switch 41. At the time of turn-on, as shown by the solid arrow in FIG. 5, a current flows from the source of the MOSFET 11 toward the gate in the first path, and the gate is charged. Power supplies 20 and 30 are located in the first path. The power supplies 20 and 30 function as a power supply which applies a driving voltage. Since the output voltage V2 is smaller than the output voltage V1, a positive voltage can be applied as the drive voltage.

When the drive command is at the H (i.e., high) level, the drive control unit 43 turns off the turn-on switch 41 and turns on the turn-off switch 42. As a result, a second path is formed between the source of the MOSFET 11 and the gate via the on switch 42. At the time of turn-off, as shown by the solid arrow in FIG. 6, a current flows from the gate of the MOSFET 11 to the source in the second path, and the charge of the gate is drawn out. The second power supply 30 is located in the second path. The second power supply 30 functions as a power supply which applies a driving voltage. Since the positive electrode of the second power supply 30 is connected to the source of the MOSFET 11, it is possible to apply a negative voltage as the drive voltage.

The turn-off drive command for turning off the MOSFET 11 is an H level signal. When the MOSFET 11 is driven off, a second path is formed as described above. The second power supply 30 is located in the second path. The turn-on drive command for turning on MOSFET 11 is a signal having a predetermined duty ratio. When a positive voltage is applied to drive the MOSFET 11 on, the first path is formed as described above. Power supplies 20 and 30 are located in the first path.

The output switching unit 50 is a circuit that outputs a switching signal of the output voltage V2 to the second power supply 30. The MOSFET 11 has an on-drive period, in which the MOSFET 11 is driven on-state, and an off-drive period, in which the MOSFET 11 is driven off-state, as drive periods. The on-drive period includes a turn-on period and a full-on period. The off-drive period includes a turn-off period and a full-off period. The output switching unit 50 outputs a switching signal so that the output voltage V2 becomes zero (i.e., 0V) in the first period of the driving period and the output voltage V2 becomes a predetermined voltage in the second period. The switching signal is a signal for commanding the target value of the output voltage V2 to the second power supply 30. The first period is a period including at least a part of the on-drive period. The second period is the remaining part of the driving period excluding the first period. In this embodiment, the predetermined voltage is 5V.

In FIG. 7, as an example, the first period substantially coincides with the on-drive period, and the second period substantially coincides with the off-drive period. With the switching from the off drive period to the on drive period, the output voltage V2 is switched from 5 V to zero (0 V) by the switching signal. Since the output voltage V2 of the second power supply 30 becomes zero in the first path, the output voltage V1 (i.e., 20V) can be applied to the gate as a positive voltage as shown in FIG. 7. With the switching from the on drive period to the off drive period, the output voltage V2 is switched from 0V to 5V by the switching signal. Since the output voltage V2 of the second power supply 30 becomes 5V in the second path, a negative voltage (i.e., −5V) can be applied to the gate.

<Summary of First Embodiment>

Figure 8:
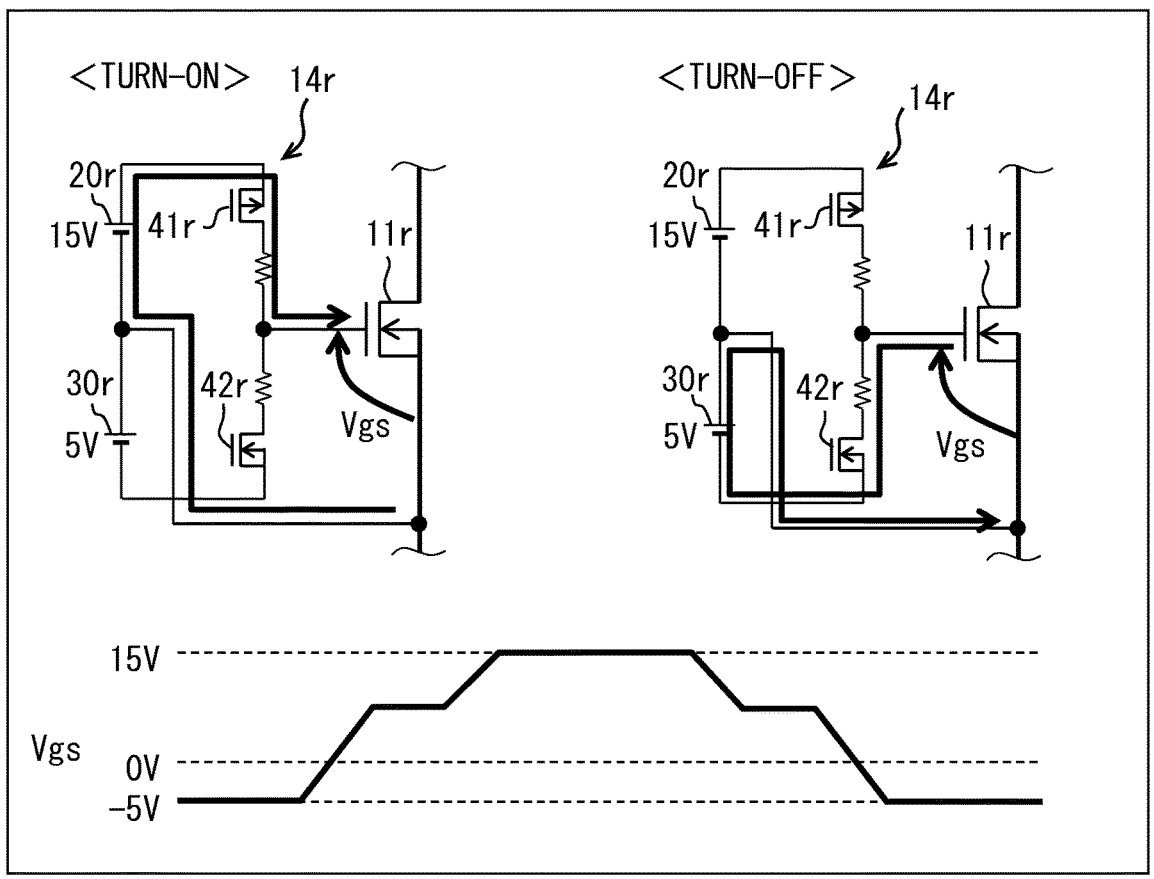
FIG. 8 is a diagram showing a reference example.
Figure 9:
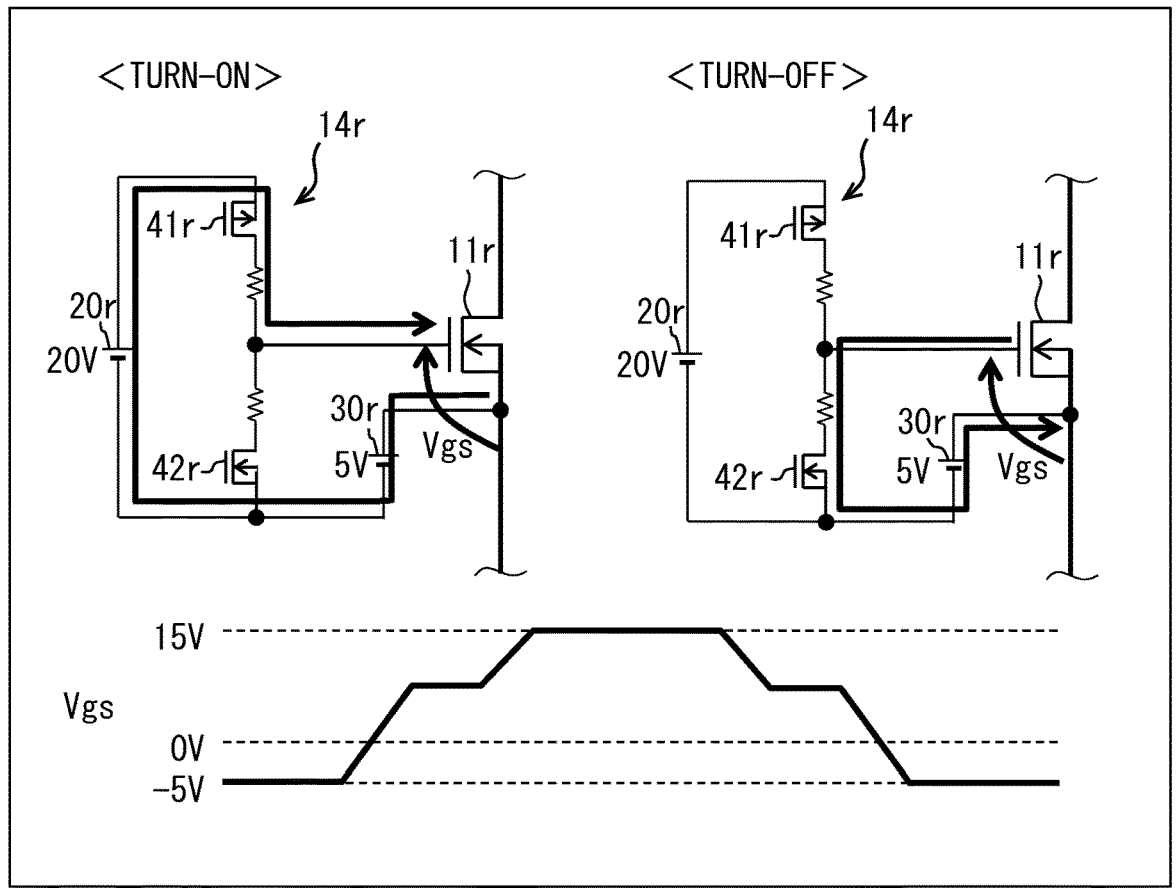
FIG. 9 is a diagram showing a reference example.

FIGS. 8 and 9 show reference examples. In the reference example, the elements identical or related to the present embodiment are denoted by adding "r" to the tails of the reference numerals in the present embodiment. In FIGS. 8 and 9, for convenience, the drive control unit is not shown in the drive circuit 14r.

In the reference example shown in FIG. 8, the negative electrode of the first power supply 20r and the positive electrode of the second power supply 30r are connected to each other. Then, the connection points of the power supplies 20r and 30r are connected to the source of the MOSFET 11r. The series circuit of the switches 41r and 42r is connected in parallel to the series circuit of the power supplies 20r and 30r. The source of the turn-on switch 41r is connected to the positive electrode of the first power supply 20r, and the source of the turn-off switch 42r is connected to the negative electrode of the second power supply 30r.

When the turn-on switch 41r is turned on and the turn-off switch 42r is turned off, a first path is formed between the source and the gate of the MOSFET 11r via the turn-on switch 41r. At the time of turn-on, a current flows from the source of the MOSFET 11r to the gate in the first path as shown by the solid arrow. The first power supply 20r is located in the first path. When the turn-on switch 41r is turned off and the turn-off switch 42r is turned on, a second path is formed between the source and the gate of the MOSFET 11r via the turn-off switch 42r. At the time of turn-off, a current flows from the gate of the MOSFET 11r to the source in the second path as shown by the solid arrow. The second power supply 30r is located in the second path. Since the positive electrode of the second power supply 30r is connected to the source of the MOSFET 11r, it is possible to apply a negative voltage as the drive voltage.

In the drive circuit 14r shown in FIG. 8, the power supply of 20V as a whole is divided into a first power supply 20r (providing 15V) and a second power supply 30r (providing 5V). When the false turn-on is suppressed by increasing the output voltage of the second power supply 30r, which is a negative power supply, the output voltage of the first power supply 20r, which is a positive power supply, is reduced by that amount. Since the output voltage of the second power supply 30r is constant (i.e., fixed), the gate voltage Vgs in the on-drive period is lowered by the amount of the second power supply 30r. Therefore, the loss during the on-drive period becomes large. When the output voltage of the first power supply 20r is increased to reduce the loss, the output voltage of the second power supply 30r is reduced accordingly. Due to the decrease in negative voltage, the false turn-on may be likely to occur.

In the reference example shown in FIG. 9, the negative electrodes of the power supplies 20r and 30r are connected to each other. Then, the positive electrode of the second power supply 30r is connected to the source of the MOSFET 11r. The first power supply 20r is connected to the source via the second power supply 30r. The source of the turn-on switch 41r is connected to the positive electrode of the first power supply 20r, and the source of the turn-off switch 42r is connected to the connection point of the power supplies 20r, 30r. The second power supply 30r is not a variable power supply and has a constant (i.e., fixed) output. Therefore, the drive circuit 14r does not have an output switching unit.

When the turn-on switch 41r is turned on and the turn-off switch 42r is turned off, a first path is formed between the source and the gate of the MOSFET 11r via the turn-on switch 41r. At the time of turn-on, a current flows from the source of the MOSFET 11r to the gate in the first path as shown by the solid arrow. Power supplies 20r and 30r are located in the first path. When the turn-on switch 41r is turned off and the turn-off switch 42r is turned on, a second path is formed between the source and the gate of the MOSFET 11r via the turn-off switch 42r. At the time of turn-off, a current flows from the gate of the MOSFET 11r to the source in the second path as shown by the solid arrow. The second power supply 30r is located in the second path.

In the drive circuit 14r shown in FIG. 9, the power supplies 20r and 30r are located in the first path. Since the output voltage of the second power supply 30r is fixed (i.e., fixed to 5V), the gate voltage Vgs in the on-drive period is lowered by the amount of the second power supply 30r. During the on-drive period, only the difference (i.e., 15V) between the output voltage (i.e., 20V) of the first power supply 20r and the output voltage (i.e., 5V) of the second power supply 30r can be applied to the gate. Therefore, the loss during the on-drive period becomes large.

On the other hand, according to the drive circuit 14 of the present embodiment, the output voltage V2 of the second power supply 30 can be switched within a voltage range smaller than the output voltage V1 of the first power supply 20. Similar to the reference example shown in FIG. 9, the negative electrodes of the power supplies 20 and 30 are connected to each other, and the positive electrode of the second power supply 30 is connected to the source of the MOSFET 11. The first power source 20 is connected to the source via the second power source 30. When the turn-on switch 41 is turned on, a first path is formed between the source and the gate of the MOSFET 11. Since the power supplies 20 and 30 are located in the first path, a positive voltage can be applied to the gate to drive the MOSFET 11 on.

In a configuration in which the positive electrode of the second power supply 30 is connected to the source of the MOSFET 11 and the power supplies 20 and 30 are located in the first path, the difference voltage (=V1−V2) between the output voltage V1 and the output voltage V2 is applied to the gate. In the present embodiment, the output voltage V2 of the second power supply 30 is set to zero in the first period including at least a part of the on-drive period. Therefore, the drive voltage (i.e., the positive voltage) applied to the gate can be increased as compared with the case where the voltage is not zero. Therefore, the loss during the on-drive period, for example, the switching loss and the DC loss can be reduced.

On the other hand, in the driving period excluding the first period, that is, in the second period including at least a part of the off driving period, the output voltage V2 of the second power supply 30 is set to a predetermined non-zero voltage (for example, 5V). As described above, the positive electrode of the second power source 30 is connected to the source of the MOSFET 11. Therefore, a negative voltage (−5V) can be applied to the gate during the off-drive period. According to this, the false turn-on of MOSFET 11 can be suppressed. As a result, it is possible to provide a drive circuit 14 capable of reducing the loss during the on-drive period while suppressing the false turn-on.

When a wide bandgap semiconductor such as SiC is used, the gate threshold voltage (Vth) of the MOSFET is lower than when Si (silicon) is used. Therefore, the possibility of false turn-on due to noise may be further increased. In this embodiment, a negative voltage (−5V) can be applied to the gate during the off-drive period. Therefore, it is possible to suppress the false turn-on while adopting the MOSFET 11 formed on the SiC substrate.

Second Embodiment

The second embodiment is a modification of a precedent embodiment as a basic configuration and may incorporate description of the precedent embodiment.

Figure 10:
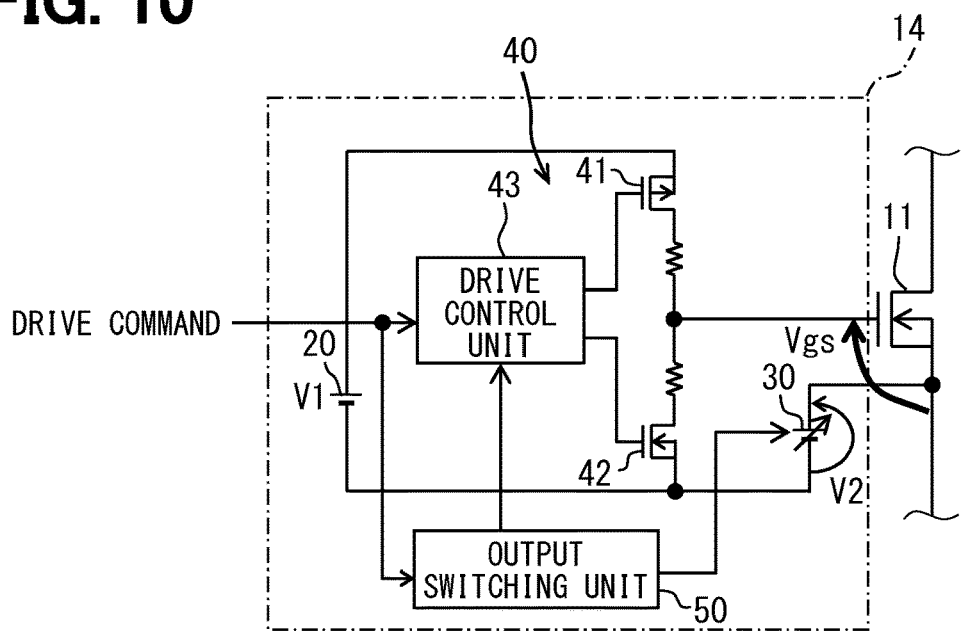
FIG. 10 is a diagram illustrating a drive circuit according to a second embodiment.

FIG. 10 shows the drive circuit 14 of the present embodiment. In the drive circuit 14, a drive command is also input to the output switching unit 50. The output switching unit 50 outputs a switching signal based on the drive command. The output switching unit 50 outputs a switching signal with the output voltage V2 at the timing when the drive command is switched.

After the switching of the output voltage V2 is completed, the drive control unit 43 switches the power supplies 20 and 30 in order to bring the MOSFET 11 (i.e., the switching element) into the drive state according to the drive command. In the present embodiment, the output switching unit 50 outputs a switching completion signal with the output voltage V2 to the drive control unit 43 of the power supply switching unit 40. When the drive control unit 43 acquires the switching completion signal, the drive control unit 43 switches the switches 41 and 42 on and off according to the drive command.

Figure 11:
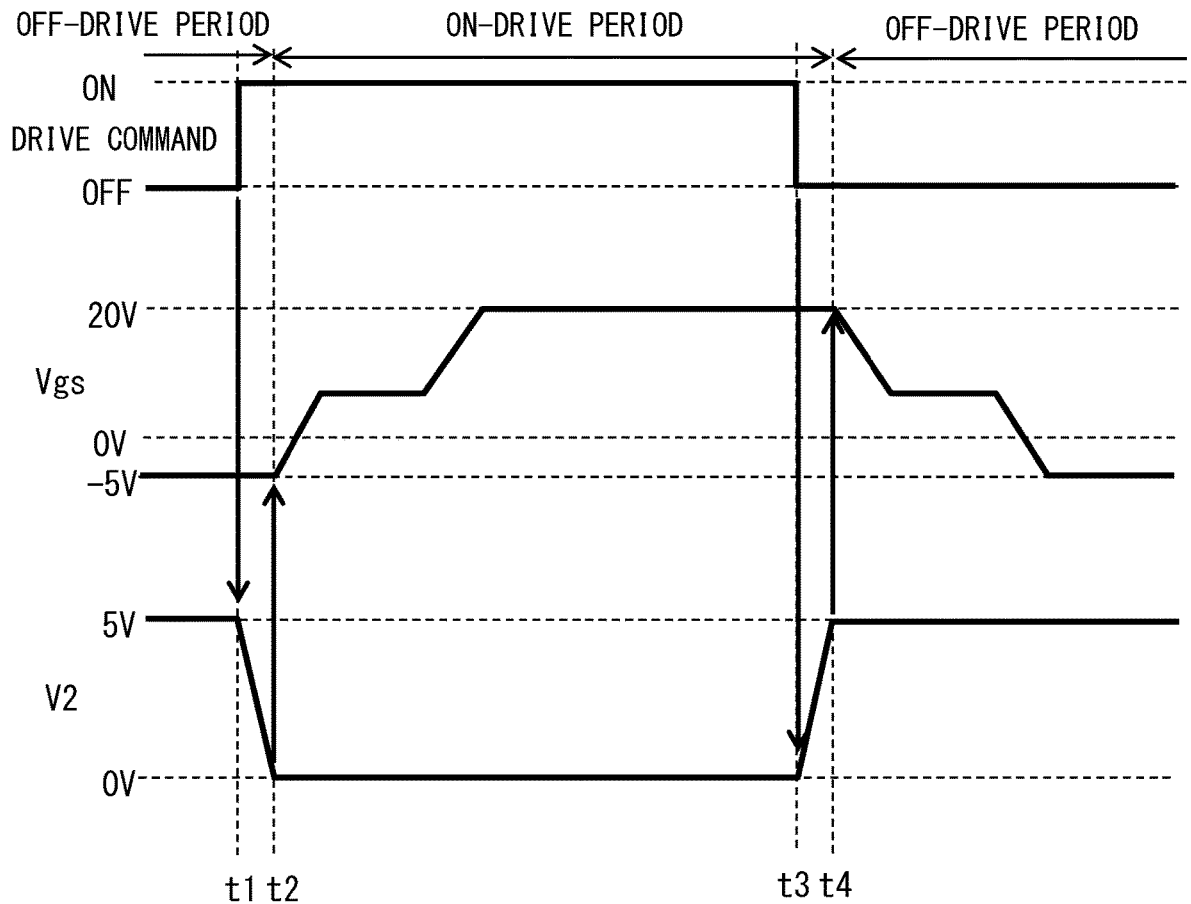
FIG. 11 is a timing chart showing switching of the output voltage V2.

FIG. 11 is a timing chart showing switching of the output voltage V2. In the following, the drive command is simplified and illustrated. The on command of the drive command indicates an on drive command, and the off command indicates an off drive command.

The output switching unit 50 outputs a switching signal for switching the output voltage V2 from 5V to zero (0V) at the timing (time t1) when the drive command is switched from the off drive command to the on drive command. The output switching unit 50 outputs a switching signal that makes the output voltage V2 zero by using the switching to the on drive command as a trigger. Due to the switching signal, the output voltage V2 of the second power supply 30 drops and becomes zero after a lapse of a predetermined time. The output switching unit 50 monitors, for example, the output voltage V2, and when the output voltage V2 falls below a predetermined threshold value, it determines that the output voltage V2 has been switched to zero. The output switching unit 50 outputs a switching completion signal at time t2.

An on-drive command is input to the drive control unit 43 at time t1. The drive control unit 43 does not start switching the power supplies 20 and 30 at time t1, but switches the power supplies 20 and 30 at time t2 when the switching completion signal is input. Specifically, the turn-on switch 41 is turned on and the turn-off switch 42 is turned off. Therefore, at time t2, the MOSFET 11 starts turning on.

The output switching unit 50 outputs a switching signal for switching the output voltage V2 from 0V to 5V at the timing (time t3) when the drive command is switched from the on drive command to the off drive command. The output switching unit 50 outputs a switching signal that makes the output voltage V2 to be 5V by using the switching to the off drive command as a trigger. Due to the switching signal, the output voltage V2 of the second power supply 30 increases and becomes 5V after a lapse of a predetermined time. When the output voltage V2 exceeds a predetermined threshold value, the output switching unit 50 determines that the voltage has been switched to 5V. The output switching unit 50 outputs a switching completion signal at time t4.

An off-drive command is input to the drive control unit 43 at time t3. The drive control unit 43 does not start switching the power supplies 20 and 30 at time t3, but switches the power supplies 20 and 30 at time t4 when the switching completion signal is input. Specifically, the turn-on switch 41 is turned off and the turn-off switch 42 is turned on. Therefore, at time t4, the MOSFET 11 starts turning off.

An example of monitoring the output voltage V2 and determining the completion of switching has been shown, but the present embodiment may not be limited to this. For example, it may be determined that the switching is completed when a predetermined time has elapsed after the switching signal is output. An example is shown in which the output switching unit 50 determines that the switching of the output voltage V2 is completed, but the present embodiment may not be limited to this. For example, the drive control unit 43 may monitor the output voltage V2 and determine the completion of switching.

<Summary of Second Embodiment>

According to the drive circuit 14 of the present embodiment, the output switching unit 50 outputs a switching signal for making the output voltage V2 zero at the timing of switching to the on drive command. On the other hand, the drive control unit 43 of the power supply switching unit 40 switches the power supplies 20 and 30 so that the MOSFET 11 is driven on after the switching of the output voltage V2 to zero is completed. There is a time lag between the switching signal and the start of turn-on of the MOSFET 11. When the MOSFET 11 starts turning on, the output voltage V2 is switched to zero. Therefore, the loss during the on-drive period can be effectively reduced. In particular, switching loss at turn-on can be effectively reduced.

Further, the output switching unit 50 outputs a switching signal for setting the output voltage V2 to 5V (i.e., the predetermined voltage) at the timing of switching to the off drive command. On the other hand, the drive control unit 43 of the power supply switching unit 40 switches the power supplies 20 and 30 so that the MOSFET 11 is driven off after the switching of the output voltage V2 to be 5V is completed. There is a time lag between the switching signal and the start of turn-off of the MOSFET 11. When the MOSFET 11 starts turning off, the output voltage V2 is switched to be 5V. Therefore, the switching loss at the time of turn-off can be reduced.

Third Embodiment

The second embodiment is a modification of a precedent embodiment as a basic configuration and may incorporate description of the precedent embodiment.

Figure 12:
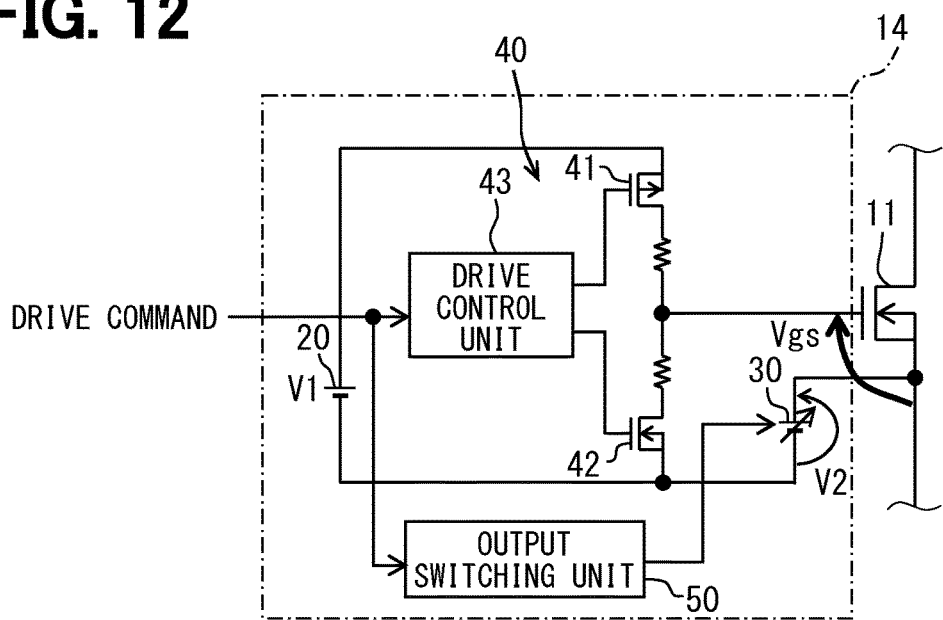
FIG. 12 is a diagram illustrating a drive circuit according to a third embodiment.

FIG. 12 shows the drive circuit 14 of the present embodiment. Similar to the second embodiment, in the drive circuit 14, a drive command is also input to the output switching unit 50. The output switching unit 50 outputs a switching signal based on the drive command. The output switching unit 50 outputs a switching signal with the output voltage V2 at the timing when the drive command is switched. The drive control unit 43 of the power supply switching unit 40 switches the power supplies 20 and 30 based on the drive command.

Figure 13:
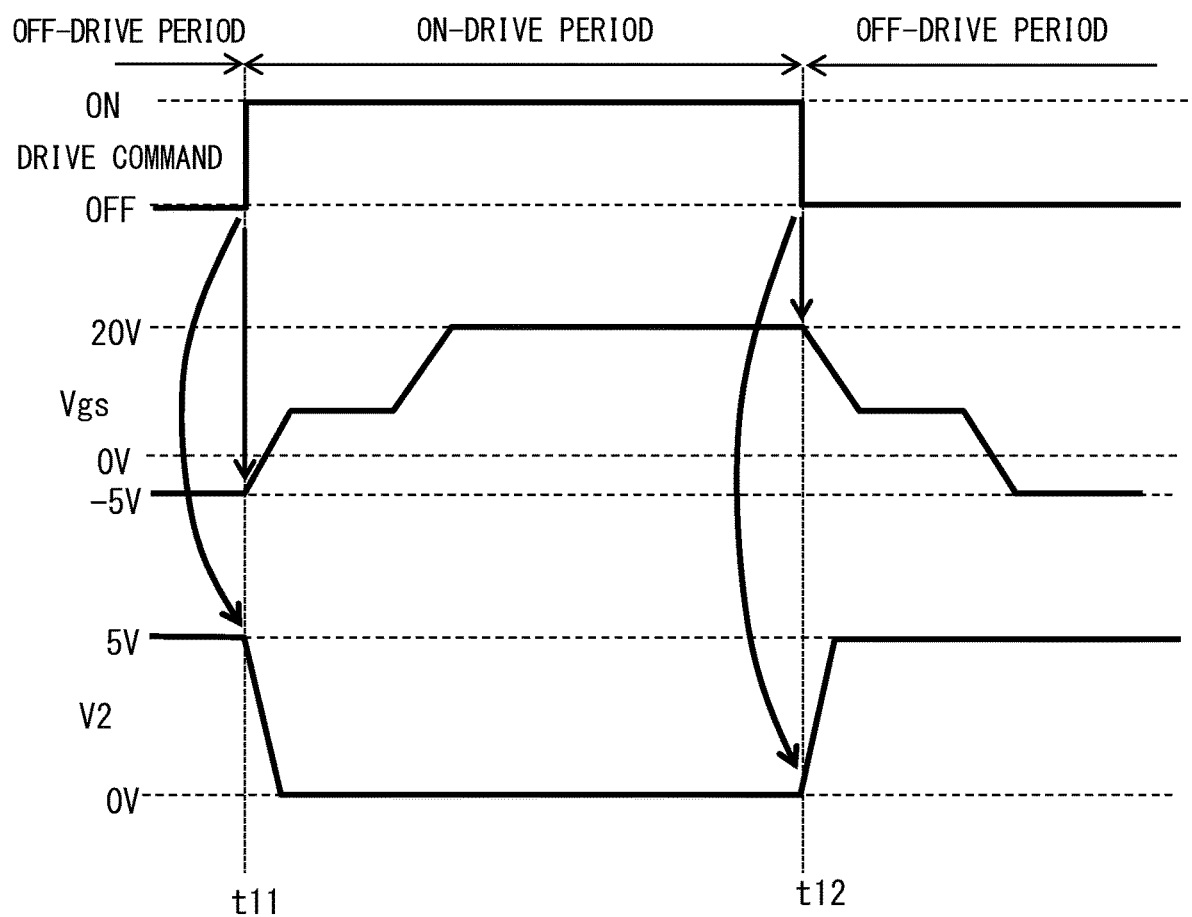
FIG. 13 is a timing chart showing switching of the output voltage V2.

FIG. 13 is a timing chart showing switching of the output voltage V2. The output switching unit 50 outputs a switching signal for switching the output voltage V2 from 5V to zero (0V) at the timing (time t11) when the drive command is switched from the off drive command to the on drive command. The output switching unit 50 outputs a switching signal that makes the output voltage V2 zero by using the switching to the on drive command as a trigger. The output voltage V2 of the second power supply 30 is lowered by the switching signal. The output voltage V2 drops from time t11 and becomes zero after a predetermined time has elapsed.

An on-drive command is input to the drive control unit 43 at time t11. The drive control unit 43 switches the power supplies 20 and 30 when an on drive command is input. Specifically, the turn-on switch 41 is turned on and the turn-off switch 42 is turned off. Therefore, at time t11, the MOSFET 11 starts turning on.

The output switching unit 50 outputs a switching signal for switching the output voltage V2 from 0V to 5V at the timing (time t12) when the drive command is switched from the on drive command to the off drive command. The output switching unit 50 outputs a switching signal that makes the output voltage V2 to be 5V by using the switching to the off drive command as a trigger. The output voltage V2 of the second power supply 30 is increased by the switching signal. The output voltage V2 rises from time t12 and becomes 5V after a lapse of a predetermined time.

An off-drive command is input to the drive control unit 43 at time t12. The drive control unit 43 switches the power supplies 20 and 30 when an off drive command is input. Specifically, the turn-on switch 41 is turned off and the turn-off switch 42 is turned on. Therefore, at time t12, the MOSFET 11 starts turning off.

<Summary of Third Embodiment>

According to the drive circuit 14 of the present embodiment, the output switching unit 50 outputs a switching signal for making the output voltage V2 zero at the timing of switching to the on drive command. Further, the drive control unit 43 switches the power supplies 20 and 30 so that the MOSFET 11 is driven on. When the off drive command is switched to the on drive command, the MOSFET 11 immediately starts turning on. Therefore, the dead time of the upper and lower arm circuits 9 can be reduced. Immediately after the start of turn-on, the switching of the output voltage V2 is not completed, and the switching speed is slower than that of the second embodiment. However, since the output voltage V2 is switched from 5V to zero, the loss during the on-drive period can be reduced.

Similarly, at the timing of switching to the off drive command, the output switching unit 50 outputs a switching signal for setting the output voltage V2 to 5V. Further, the drive control unit 43 switches the power supplies 20 and 30 so that the MOSFET 11 is driven off. When the on drive command is switched to the off drive command, the MOSFET 11 immediately starts turning off. Therefore, the dead time of the upper and lower arm circuits 9 can be reduced. Immediately after the start of turn-off, the switching of the output voltage V2 is not completed, and the switching speed is slower than that of the second embodiment. However, since the output voltage V2 is switched from zero to 5V, it is possible to suppress the false turn-on.

Fourth Embodiment

The second embodiment is a modification of a precedent embodiment as a basic configuration and may incorporate description of the precedent embodiment. In the preceding embodiment, an example in which the output voltage V2 is switched by using the drive command of the MOSFET 11 that is a drive target as a trigger is shown. In this embodiment, the drive command of the opposing arm is used as a trigger to switch the output voltage V2 to zero.

Figure 14:
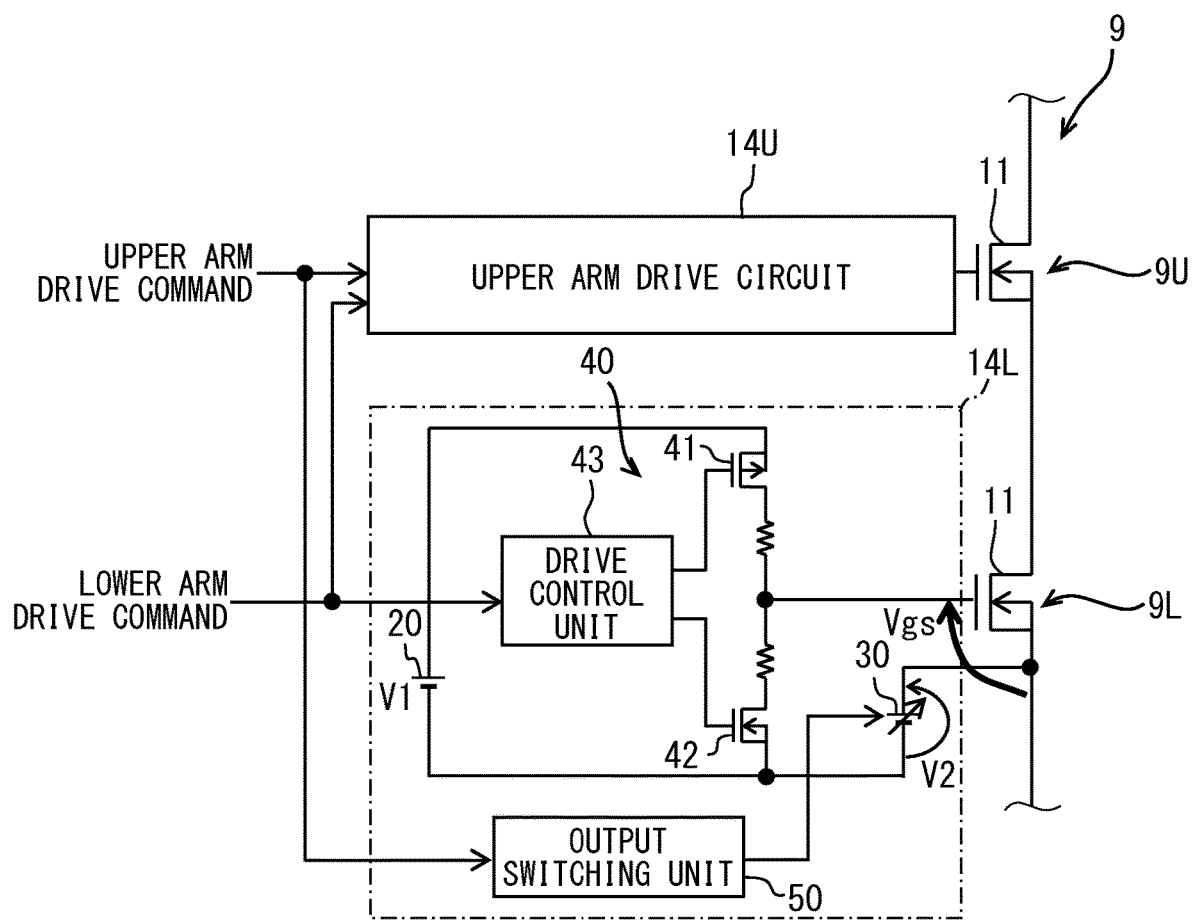
FIG. 14 is a diagram illustrating a drive circuit according to a fourth embodiment.

In FIG. 14, the upper arm drive circuit 14U and the lower arm drive circuit 14L have the same configuration as each other. Hereinafter, the lower arm drive circuit 14L will be described. The MOSFET 11 constituting the lower arm 9L is a drive target of the lower arm drive circuit 14L. The MOSFET 11 constituting the upper arm 9U is not a drive target of the lower arm drive circuit 14L. In the following, the arm to be driven may be referred to as a self-arm. Another arm that is not a drive target but constitutes the upper and lower arm circuit 9 together with the own arm is an opposing arm. The MOSFET 11 constituting the lower arm 9L corresponds to the first switching element, and the MOSFET 11 constituting the upper arm 9U corresponds to the second switching element.

The lower arm drive circuit 14L has almost the same configuration as that of the preceding embodiment. In the present embodiment, a drive command for the upper arm 9U, which is an opposing arm, is input to the output switching unit 50 of the lower arm drive circuit 14L. The output switching unit 50 outputs a switching signal for switching the output voltage V2 to zero at the timing when the upper arm drive command is switched to the off drive command. Similarly, a lower arm drive command is input to the output switching unit 50 (not shown) of the upper arm drive circuit 14U.

Figure 15:
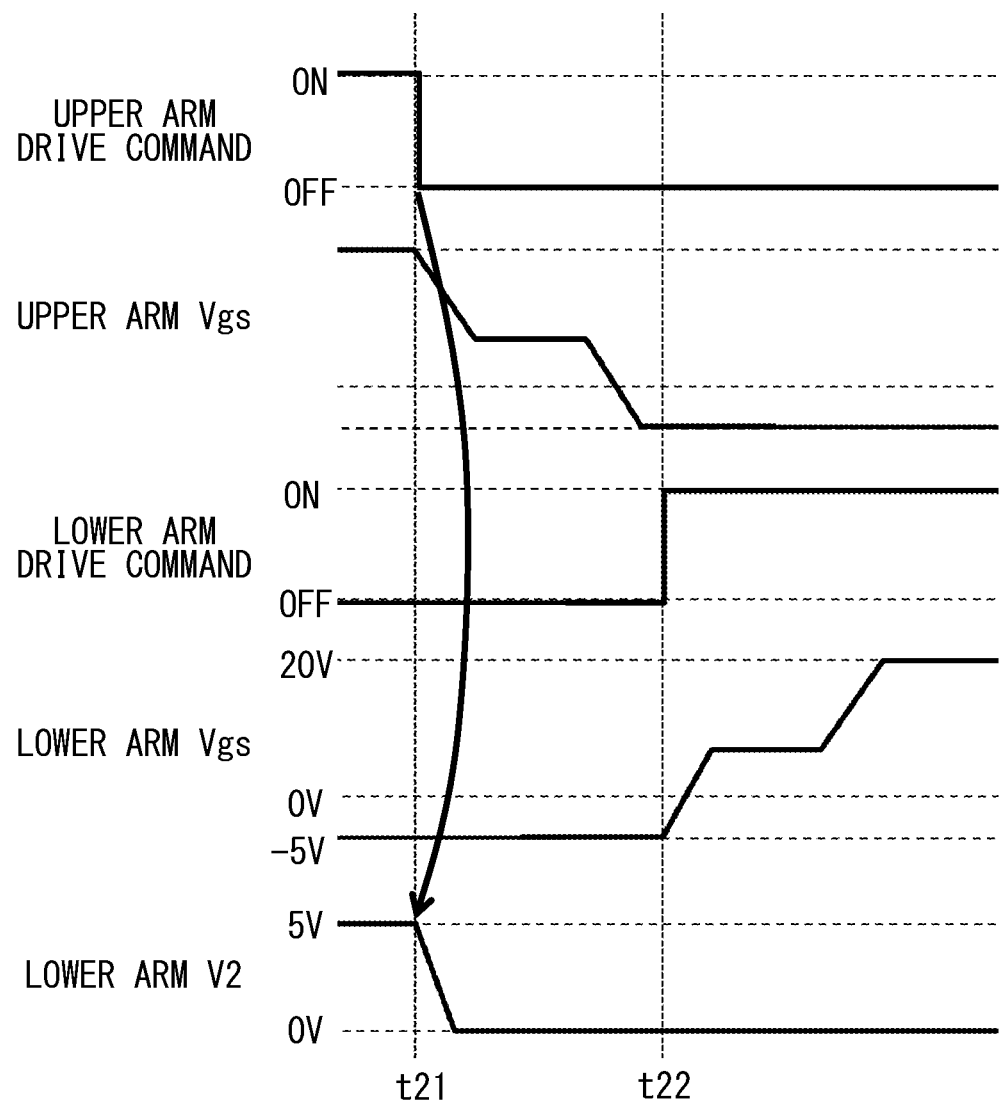
FIG. 15 is a timing chart showing switching of the output voltage V2.

FIG. 15 is a timing chart showing switching of the output voltage V2 in the lower arm drive circuit 14L.

The output switching unit 50 of the lower arm drive circuit 14L outputs a switching signal for switching the output voltage V2 from 5V to zero (0V) at the timing (time t21) when the upper arm drive command switches from the on drive command to the off drive command. The output switching unit 50 outputs a switching signal that makes the output voltage V2 zero by using the switching of the opposite arm to the off drive command as a trigger. Due to the switching signal, the output voltage V2 of the second power supply 30 drops and becomes zero after a lapse of a predetermined time. The output voltage V2 switches to zero during the dead time. The dead time is a period during which both the MOSFET 11 of the upper arm 9U and the MOSFET 11 of the lower arm 9L are off-driven in order to suppress a short circuit between the upper and lower arms.

At time t22, when the dead time has elapsed from time t21, the lower arm drive command is switched to the on drive command. As a result, the MOSFET 11 of the lower arm 9L starts turning on.

<Summary of Fourth Embodiment>

According to the lower arm drive circuit 14L of the present embodiment, the output switching unit 50 outputs a switching signal for switching the output voltage V2 of the second power supply 30 to zero at the timing when the upper arm drive command is switched to the off drive command. The output switching unit 50 switches the output voltage V2 to zero by using the switching of the opposite arm (upper arm 9U) to the off drive command as a trigger. The output voltage V2 switches to zero during the dead time. Therefore, the output voltage V2 is zero at the time t22 when the lower arm drive command is switched to the on drive command and the MOSFET 11 starts turning on. It may not be necessary to take an extra time for switching the output voltage V2 as a dead time. It is possible to effectively reduce the loss during the on-drive period while suppressing the increase in the dead time.

Although the lower arm drive circuit 14L has been described, the same applies to the upper arm drive circuit 14U. The switching of the output voltage V2 from zero to 5V can be combined with other embodiments. For example, the switching of the drive command of the own arm to the off drive command may be used as a trigger.

Fifth Embodiment

The second embodiment is a modification of a precedent embodiment as a basic configuration and may incorporate description of the precedent embodiment. In this embodiment, the output voltage V2 is switched according to the driving state of the opposing arm.

Similar to the fourth embodiment, the lower arm drive circuit 14L will be described in this embodiment as well. That is, the lower arm 9L is defined as the own arm and the upper arm 9U is defined as the opposite arm. The MOSFET 11 constituting the lower arm 9L corresponds to the first switching element, and the MOSFET 11 constituting the upper arm 9U corresponds to the second switching element.

The lower arm drive circuit 14L has almost the same configuration as that of the preceding embodiment. The output switching unit 50 of the lower arm drive circuit 14L outputs a switching signal based on the driving state of the MOSFET 11 of the upper arm 9U, which is the opposite arm. The output switching unit 50 outputs a switching signal so that the output voltage V2 becomes 5V (i.e., the predetermined voltage) in a predetermined period including from the start of the turn-on of the MOSFET 11 constituting the upper arm 9U to the completion of the turn-on. The predetermined period includes at least a transition period in which the MOSFET 11 of the upper arm 9U is turned on. The output switching unit 50 outputs a switching signal so that the output voltage V2 becomes zero (0V) in a period other than the above-mentioned predetermined period.

Figure 16:
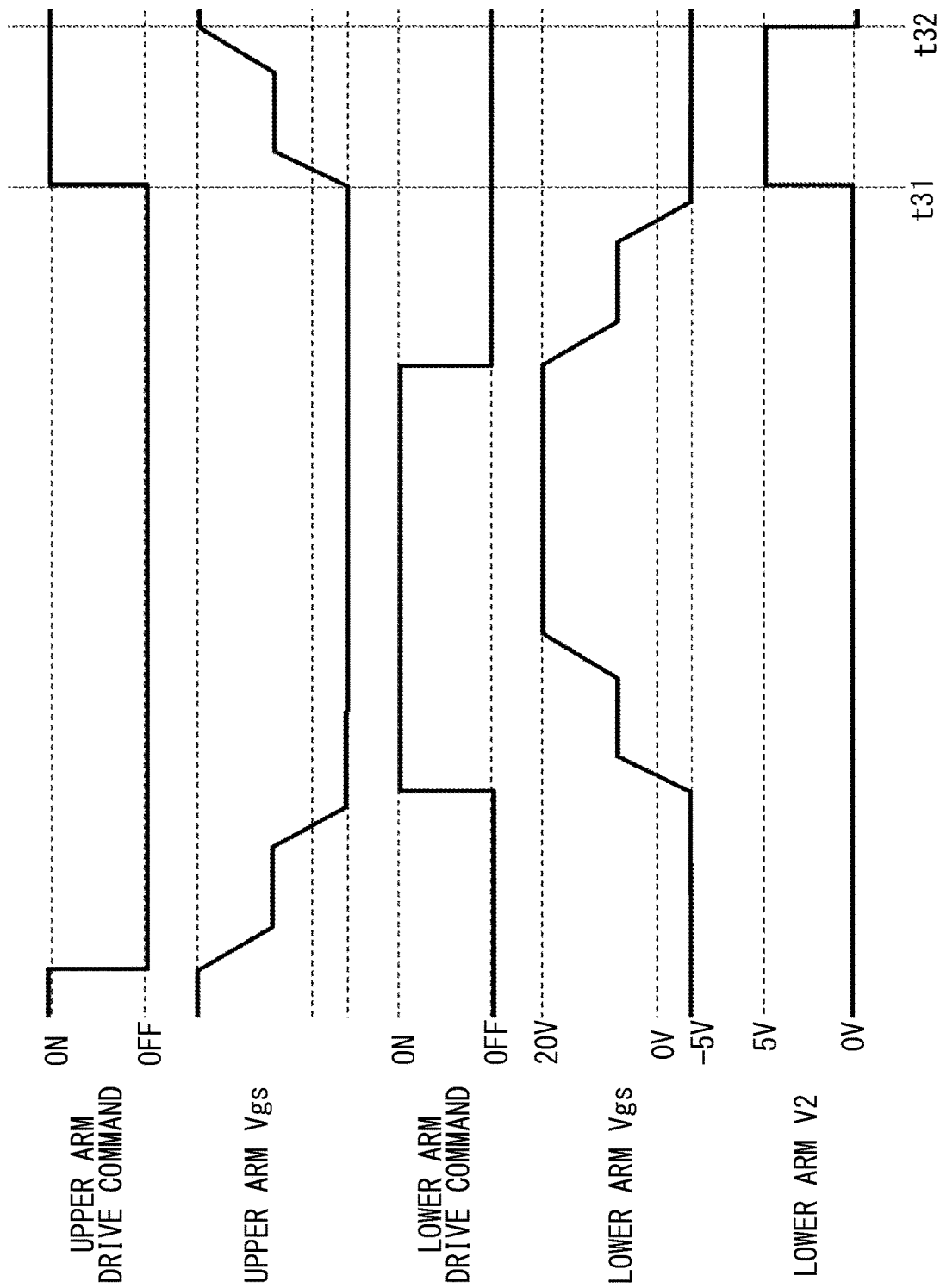
FIG. 16 is a timing chart showing switching of the output voltage V2 in the fifth embodiment.

FIG. 16 is a timing chart showing switching of the output voltage V2 in the lower arm drive circuit 14L. The output switching unit 50 of the lower arm drive circuit 14L outputs a switching signal for switching the output voltage V2 from zero volts (i.e., 0V) to 5V at the timing (time t31) when the upper arm drive command switches from the off drive command to the on drive command. The output switching unit 50 outputs a switching signal that makes the output voltage V2 to be 5V by using the switching of the opposite arm to the on drive command as a trigger. As a result, the output voltage V2 becomes 5V.

Further, the output switching unit 50 outputs a switching signal for switching the output voltage V2 from 5V to zero at the time t32 when a predetermined time has elapsed from the time t31. As a result, the output voltage V2 becomes zero. The predetermined time is set to include a transition period in which the MOSFET 11 constituting the upper arm 9U is turned on. The predetermined time may be matched with the time required for the turn-on transition, or may be the time obtained by adding a predetermined margin to the transition time.

<Summary of Fifth Embodiment>

According to the lower arm drive circuit 14L of the present embodiment, a negative voltage can be applied to the gate of the MOSFET 11 of the own arm (i.e., the lower arm 9L) during the period when the MOSFET 11 of the upper arm 9U turns on. Therefore, it is possible to suppress the occurrence of the false turn-on due to the turn-on of the opposing arm. Further, since the output voltage V2 is set to zero in the period other than the predetermined period, the loss in the on-drive period can be reduced.

Although the lower arm drive circuit 14L has been described, the same applies to the upper arm drive circuit 14U. Regarding the switching of the output voltage V2 from 5V to zero, it may be possible to combine the switching with any of the preceding embodiments. For example, the switching of the drive command of the own arm to the on drive command may be a trigger. Further, it may be combined with the fourth embodiment. In this case, the output voltage V2 is set to 5V while the upper arm drive command is the on drive command, and the output voltage V2 is set to zero while the upper arm drive command is the off drive command.

An example of switching the output voltage V2 based on the drive command of the opposing arm has been shown, but the present embodiment may not be limited to this. Regarding the MOSFET 11 of the opposing arm, as described in the embodiment (sixth embodiment) described later, the physical quantity correlating with the driving state may be detected to determine the driving state, and the output voltage V2 may be switched. The output voltage V2 is switched to zero based on the switching from the off drive state to the on drive state. The output voltage V2 is switched to 5V based on the switching from the on drive state to the off drive state. Physical quantities include gate voltage Vgs, drain current Ids, chip temperature, and the like.

Sixth Embodiment

The second embodiment is a modification of a precedent embodiment as a basic configuration and may incorporate description of the precedent embodiment. In the preceding embodiment, an example of switching the output voltage V2 by using a drive command as a trigger is shown. In this embodiment, the drive state of the MOSFET 11 as a driving target is detected based on a physical quantity that correlates with the drive state, and the output voltage V2 is switched.

Figure 17:
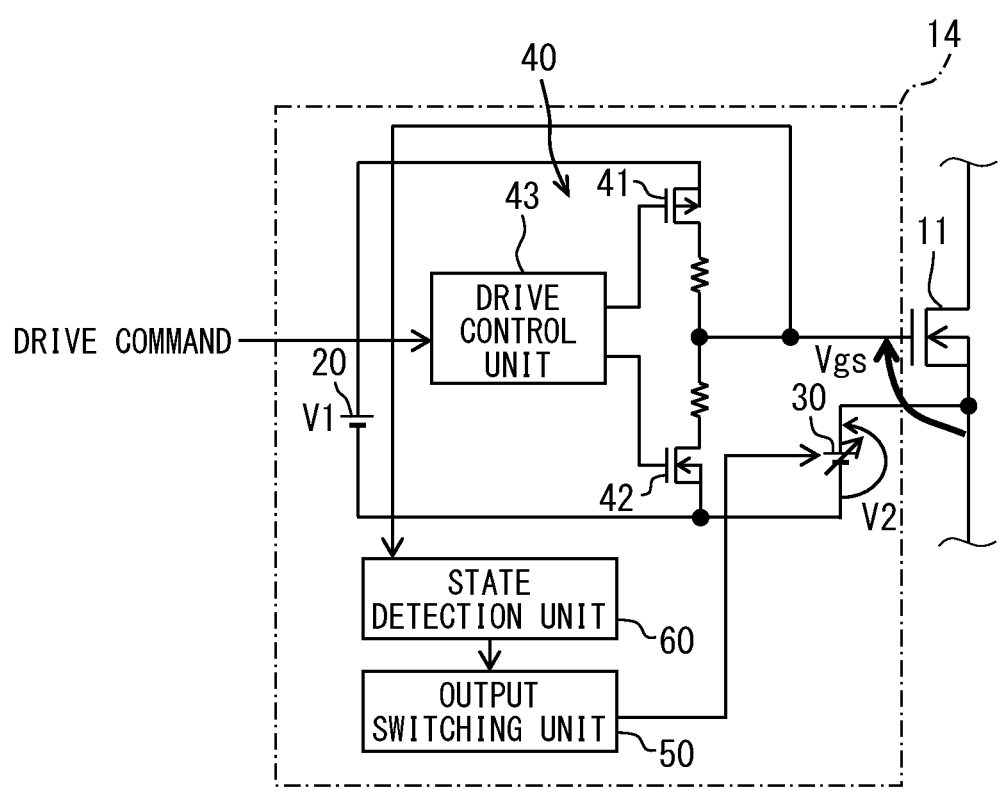
FIG. 17 is a diagram illustrating a drive circuit according to a sixth embodiment.

As shown in FIG. 17, the drive circuit 14 of the present embodiment further includes a state detection unit 60 with respect to the configuration described in the first embodiment. The state detection unit 60 detects the gate voltage Vgs of the MOSFET 11 which is the drive target of the drive circuit 14. The state detection unit 60 detects the driving state of the MOSFET 11 based on the detected gate voltage Vgs. The output switching unit 50 outputs a switching signal based on the switching of the driving state.

Figure 18:
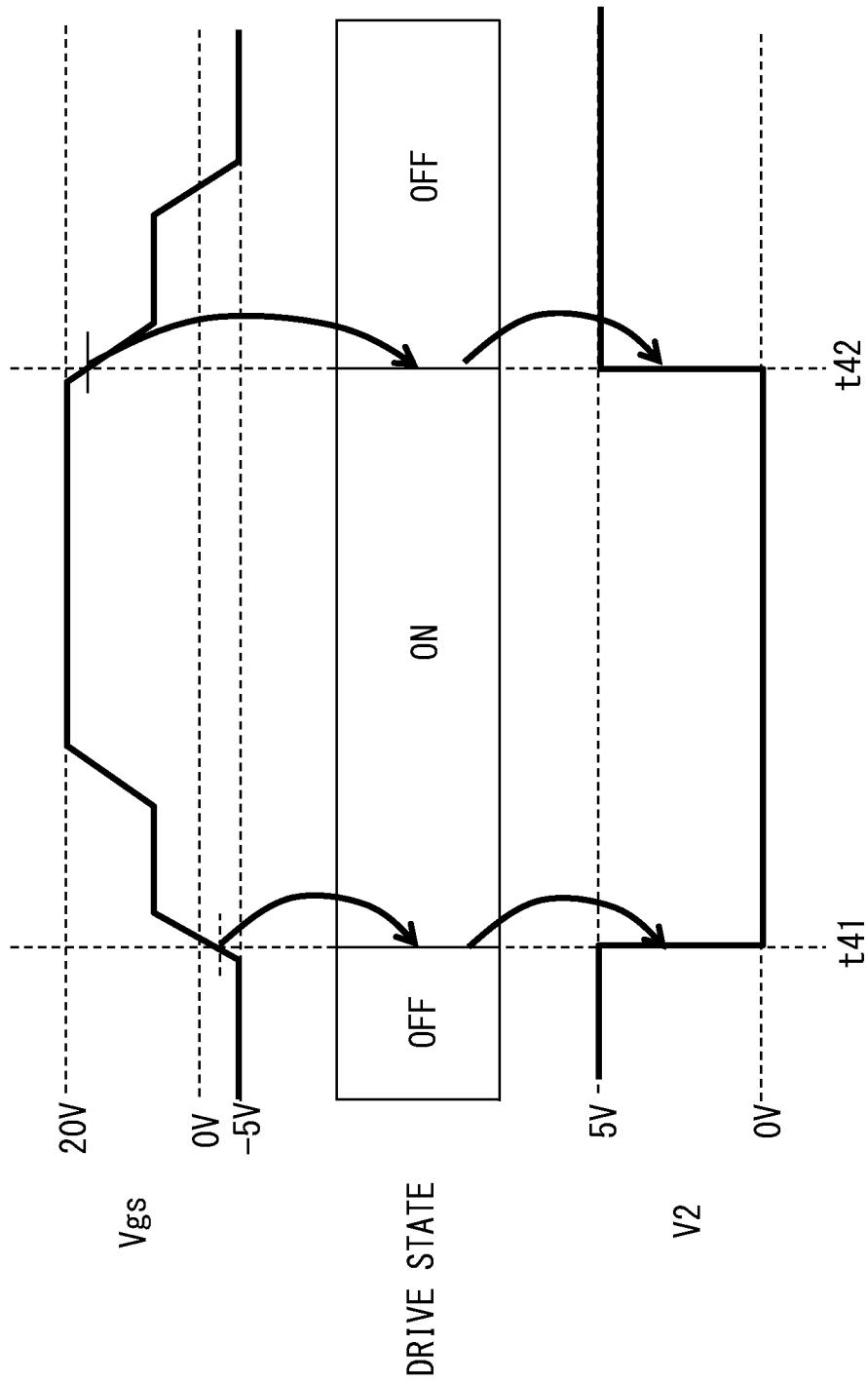
FIG. 18 is a timing chart showing switching of the output voltage V2.

FIG. 18 is a timing chart showing switching of the output voltage V2. The state detection unit 60 detects the on state when the gate voltage Vgs rises from the off state (i.e., the full off state) and exceeds a predetermined threshold value at time t41. That is, the switching from the off drive state to the on drive state is detected. The state detection unit 60 detects an off drive state when the gate voltage Vgs drops from the on state (i.e., the full on state) and falls below a predetermined threshold value at time t42. That is, the switching from the on drive state to the off drive state is detected. The state detection unit 60 detects that the drive state of the MOSFET 11 is the on drive state between the time t41 and the time t42. During the other period, it is detected that the driving state of the MOSFET 11 is the off driving state.

The output switching unit 50 outputs a switching signal for making the output voltage V2 zero based on the timing (time t41) of switching from the off drive state to the on drive state. In the present embodiment, when the drive state is switched to the ON drive state, the output switching unit 50 immediately outputs a switching signal for setting the output voltage V2 to zero. The output switching unit 50 outputs a switching signal for making the output voltage V2 to be 5V (i.e., the predetermined voltage) based on the timing (at time t42) of switching from the on drive state to the off drive state. In the present embodiment, when the drive state is switched to the off drive state, the output switching unit 50 immediately outputs a switching signal for setting the output voltage V2 to 5V.

<Summary of Fifth Embodiment>

According to the drive circuit 14 of the present embodiment, the drive state of the MOSFET 11 to be driven can be detected based on the gate voltage Vgs which is a physical quantity. Then, the output voltage V2 can be switched by using the switching of the drive state as a trigger. The output voltage V2 can be switched at a timing according to the driving state of the MOSFET 11. As a result, the loss during the on-drive period can be reduced. In addition, it is possible to suppress the false turn-on.

An example has been shown in which the state detection unit 60 has a function of detecting the gate voltage Vgs and a function of detecting the driving state of the MOSFET 11 based on the gate voltage Vgs, but the present embodiment may not be limited to this. A voltage detection unit that detects the gate voltage Vgs may be provided separately. The output switching unit 50 may be provided with a function of detecting the driving state.

Figure 19:
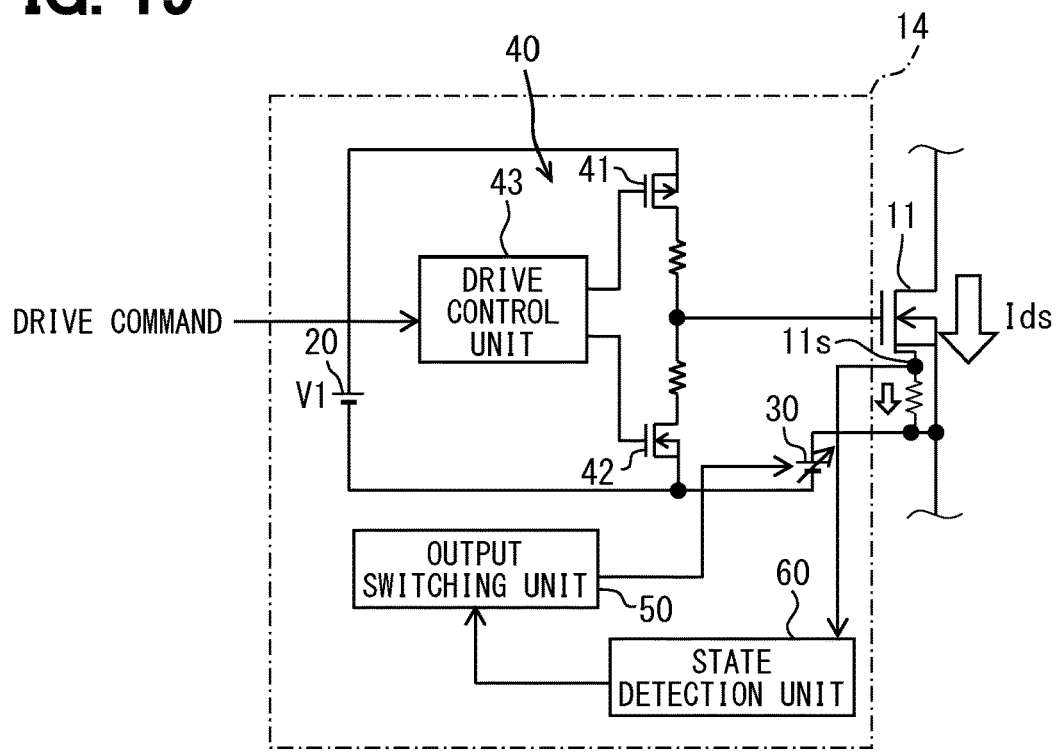
FIG. 19 is a diagram showing a modification.

The physical quantity that correlates with the driving state may not be limited to the gate voltage Vgs described above. In the modified example shown in FIG. 19, the drive state is detected based on the drain current Ids. A sense element having the same structure as the MOSFET 11 (as a main element) is provided on the substrate (or a chip) on which the MOSFET 11 is formed. The area of the sense element is, for example, about 1/1000 to 1/10000 of the MOSFET 11. As for the sense current, the drain current is proportional to the area. Therefore, the drain current Ids can be detected via the sense terminal 11s of the sense element.

The state detection unit 60 detects the drain current Ids of the MOSFET 11. The drain current Ids varies, for example, as shown in FIG. 3. The state detection unit 60 detects the driving state of the MOSFET 11 based on the detected drain current Ids. When the drain current Ids rises from the off state and exceeds a predetermined threshold value, switching to the on drive state is detected. When the drain current Ids drops from the on state and falls below a predetermined threshold value, switching to the off state is detected. The output switching unit 50 outputs a switching signal based on the switching of the driving state.

A shunt resistor may be used instead of the sense element. The shunt resistor is connected in series with the MOSFET 11. The voltage across the shunt resistor is proportional to the drain current Ids. Therefore, the drain current Ids can be detected.

When the main current is detected as a physical quantity, the output voltage V2 may be switched according to the current range. For example, when the switching element is an IGBT, the smaller the main current (i.e., the collector current), the faster the switching speed of the opposing arm, and the more likely it may be that the false turn-on will occur. On the other hand, the larger the main current, the slower the switching speed of the opposing arm, and the less likely it may be that the false turn-on will occur. Therefore, the output voltage V2 may be set to 5V in the small current region (for example, 0 to 50 A), and the output voltage V2 may be set to zero in the large current region (for example, 50 A or more). According to this, it is possible to reduce the loss during the on-drive period while suppressing the false turn-on.

The driving state may be detected based on the temperature (i.e., the chip temperature) of the substrate on which the MOSFET 11 is formed. The heat generation state of the MOSFET 11 may vary depending on the driving state. When the temperature rises from the off state and exceeds a predetermined threshold value, the on drive state is detected. When the temperature drops from the on state and falls below a predetermined threshold value, the off drive state is detected.

Seventh Embodiment

The second embodiment is a modification of a precedent embodiment as a basic configuration and may incorporate description of the precedent embodiment. In this embodiment, an example of the configuration of the second power supply 30 is shown.

Figure 20:
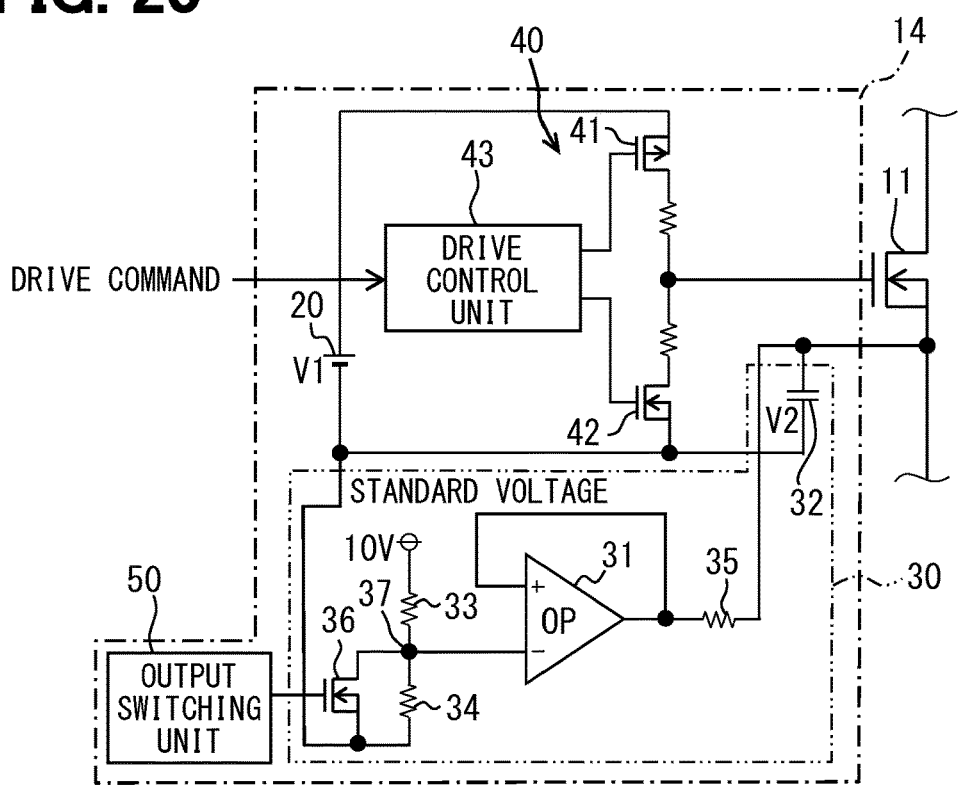
FIG. 20 is a diagram illustrating a drive circuit according to a seventh embodiment.

FIG. 20 shows the drive circuit 14 of the present embodiment. The basic configuration of the drive circuit 14 is the same as that of the first embodiment. The second power supply 30 includes an operational amplifier 31, a capacitor 32, resistors 33 to 35, and a changeover switch 36. The output terminal of the operational amplifier 31 is connected to the non-inverting input terminal (i.e., a positive terminal) of the operational amplifier 31. The output terminal is connected to the positive electrode of the capacitor 32 via the resistor 35. The positive electrode of the capacitor 32 is connected to the source of the MOSFET 11. The negative electrode of the capacitor 32 is connected to the negative electrode of the first power supply 20.

The connection point 37 of the resistors 33 and 34 is connected to the inverting input terminal (i.e., the negative terminal) of the operational amplifier 31. The resistor is connected in series between the voltage source that supplies the reference voltage of 10 V and the connection point of the power supplies 20 and 30. The resistors 33 and 34 are voltage dividing resistors. In this embodiment, the values of the resistors 33 and 34 are equal to each other. The changeover switch 36 is connected in parallel to the resistor 34. In the present embodiment, the changeover switch 36 is an n-channel MOSFET, and the drain is connected to the connection point 37.

A changeover signal is input to the gate of the changeover switch 36. The changeover switch 36 turns on and off according to the changeover signal. When the changeover signal for making the output voltage V2 zero is input, the changeover switch 36 is turned on. As a result, the connection point 37 is connected to the connection point of the power supplies 20 and 30 without passing through the resistor 34, and the voltage of the connection point 37 becomes zero (0V). Therefore, the output from the operational amplifier 31 also becomes zero, and the output voltage V2, which is the voltage across the capacitor 32, also becomes zero. When a changeover signal for setting the output voltage V2 to a predetermined voltage (i.e., 5 V) is input, the changeover switch 36 is turned off. As a result, the voltage at the connection point 37 becomes 5V, and the output of the operational amplifier 31 also becomes 5V. Therefore, the output voltage V2 becomes 5V.

<Summary of Seventh Embodiment>

According to the drive circuit 14 of the present embodiment, the output voltage V2 can be switched according to the switching signal. The output voltage V2 can be reduced to zero during the on-drive period to reduce the loss. During the off-drive period, the output voltage V2 is set to a predetermined voltage (i.e., 5V), whereby a negative voltage can be applied to the gate of the MOSFET 11. Therefore, it is possible to suppress the false turn-on.

The timing of generating the switching signal by the output switching unit 50 can be combined with other embodiments.

Figure 21:
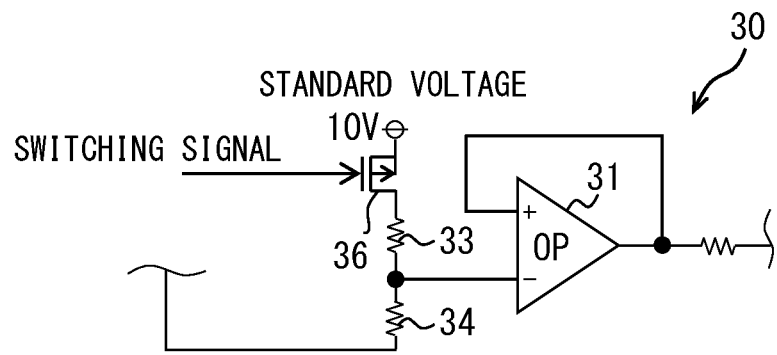
FIG. 21 is a diagram showing a modification.

The configuration of the second power supply 30 may not be limited to the above example. The modified example shown in FIG. 21 shows the periphery of the operational amplifier 31 in the drive circuit 14. In FIG. 21, a changeover switch 36 is provided between a voltage source that supplies a reference voltage and a resistor 33. When a changeover signal for setting the output voltage V2 to zero is input, the changeover switch 36 is turned off, and the voltage source and the resistor 33 are cut off. Therefore, the output of the operational amplifier 31 becomes zero, and the output voltage V2 also becomes zero. When a changeover signal for setting the output voltage V2 to 5 V is input, the changeover switch 36 is turned on, and the voltage source and resistor 33 are in a conductive state. Therefore, the output of the operational amplifier 31 becomes 5V, and the output voltage V2 also becomes 5V.

Figure 22:
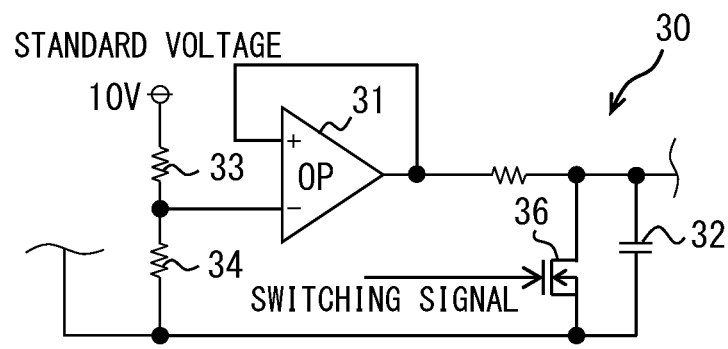
FIG. 22 is a diagram showing a modification.

An example of switching the output voltage V2 by switching the divided value of the reference voltage has been shown, but the present embodiment may not be limited to this. The modified example shown in FIG. 22 corresponds to FIG. 21. In FIG. 22, the changeover switch 36 is provided on the output side of the operational amplifier 31. The changeover switch 36 is provided between a line connecting the output terminal of the operational amplifier 31 and the positive electrode of the capacitor 32 and a line connecting the negative electrodes of the power supplies 20 and 30. When a changeover signal for making the output voltage V2 zero is input, the changeover switch 36 is turned on and the output voltage V2 becomes zero. When a switching signal for setting the output voltage V2 to 5V is input, the switching switch 36 is turned off, the output (5V) of the operational amplifier 31 is supplied to the capacitor 32, and the output voltage V2 also becomes 5V.

Other Embodiments

The disclosure in this specification and drawings etc. is not limited to the exemplified embodiment. The present disclosure encompasses the illustrated embodiments and modifications based on the embodiments by those skilled in the art. For example, the disclosure is not limited to the combinations of parts and/or elements shown in the embodiments. The present disclosure may be implemented in various combinations. The disclosure may have additional parts that may be added to the embodiment. The disclosure covers omissions of parts and/or elements of the embodiments. The disclosure covers replacement or combination of components, elements between one embodiment and another. The disclosed technical scope is not limited to the description of the embodiments. The several technical ranges disclosed are indicated by the description of the claims, and should be construed to include all modifications within the meaning and range equivalent to the description of the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

The control circuit 13 and the drive circuit 14 are provided by a control system including at least one computer. The computer includes at least one processor (hardware processor) that is hardware. The hardware processor may be provided by the following (i), (ii), or (iii).

(i) The hardware processor may be a hardware logic circuit. In this case, the computer is provided by a digital circuit including a number of programmed logic units (gate circuits). The digital circuit may comprise a memory for storing programs and/or data. The computer may be provided by an analog circuit. The computer may be provided with a combination of digital circuit and analog circuit.

(ii) The hardware processor may be at least one processor core that executes a program stored in at least one memory. In this case, the computer is provided by at least one memory and at least one processor core. The processor core is called, for example, a CPU. The memory is also called a storage medium. The memory is a non-transitory and tangible storage medium, which non-temporarily stores a program and/or data readable by the processor.

(iii) The hardware processor may be a combination of (i) and (ii) described above. (i) and (ii) are placed on different chips or on a common chip.

That is, the means and/or functions provided by the control circuit 13 and the drive circuit 14 can be provided by hardware only, software only, or a combination thereof.

Although the example is described such that the drive circuit 14 is adopted to the MOSFET 11 (i.e., the switching element) configuring the upper and lower arm circuits 9, the present disclosure is not limited to this. Although the example is described such that the power converter device 4 is adopted to the drive system 1, the present disclosure is not limited to this.

The controllers and methods described in the present disclosure may be implemented by a special purpose computer created by configuring a memory and a processor programmed to execute one or more particular functions embodied in computer programs. Alternatively, the controllers and methods described in the present disclosure may be implemented by a special purpose computer created by configuring a processor provided by one or more special purpose hardware logic circuits. Alternatively, the controllers and methods described in the present disclosure may be implemented by one or more special purpose computers created by configuring a combination of a memory and a processor programmed to execute one or more particular functions and a processor provided by one or more hardware logic circuits. The computer programs may be stored, as instructions being executed by a computer, in a tangible non-transitory computer-readable medium.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A drive circuit for driving a switching element by applying a drive voltage to a gate of the switching element, the drive circuit comprising:
a first power supply;
a second power supply having a negative electrode connected to a negative electrode of the first power supply, and a positive electrode connected to a main electrode of the switching element on a low potential side of the switching element, and providing an output voltage to be variable within a voltage range smaller than the first power supply;
a power supply switching unit that switches the first and second power supplies for applying the drive voltage based on a drive command that the second power supply is located in a path between the main electrode on the low potential side and the gate when the switching element is driven off, and the first power supply and the second power supply are located in the path to apply a positive voltage to the gate when the switching element is driven on; and
an output switching unit outputting an output voltage switching signal to the second power supply that the output voltage of the second power supply becomes zero in a part of a drive period of the switching element including at least a part of an on-drive period, and the output voltage becomes a predetermined voltage other than zero in a remaining part of the drive period including at least a part of an off-drive period.

2. The drive circuit according to claim 1, wherein:
the output switching unit outputs the switching signal for setting the output voltage to be zero at a timing when the drive command is switched to an on-drive command; and
the power supply switching unit switches the first and second power supplies to drive the switching element on after a switching of the output voltage is completed based on a switching to the on-drive command.

3. The drive circuit according to claim 1, wherein:
the output switching unit outputs the switching signal for setting the output voltage to be zero at a timing when the drive command is switched to an on-drive command; and the power supply switching unit switches the first and second power supplies to drive the switching element on at a timing of switching to the on-drive command.

4. The drive circuit according to claim 1, wherein:
the switching element includes a first switching element and a second switching element, and provides an upper and lower arm circuit using the first switching element connected in series with the second switching element; and
the output switching unit outputs the switching signal for setting the output voltage to be zero at a timing when the drive command for the second switching element is switched to an off-drive command.

5. The drive circuit according to claim 1, wherein:
the output switching unit outputs the switching signal for setting the output voltage to be the predetermined voltage at a timing when the drive command is switched to an off-drive command; and
the power supply switching unit switches the first and second power supplies to drive the switching element off after a switching of the output voltage is completed based on a switching to the off-drive command.

6. The drive circuit according to claim 1, wherein:
the output switching unit outputs the switching signal for setting the output voltage to be the predetermined voltage at a timing when the drive command is switched to an off-drive command; and
the power supply switching unit switches the first and second power supplies to drive the switching element off at a timing of switching to the off-drive command.

7. The drive circuit according to claim 1, wherein:
the switching element includes a first switching element and a second switching element, and provides an upper and lower arm circuit using the first switching element connected in series with the second switching element; and
the output switching unit outputs the switching signal for setting the output voltage to be the predetermined voltage in a predetermined period including from a start of turning on the second switching element to a completion of turning on, and setting the output voltage to be zero in a period other than the predetermined period.

8. The drive circuit according to claim 1, further comprising:
a state detection unit that detects a drive state of the switching element based on a physical quantity that correlates with the drive state of the switching element, wherein:
the output switching unit outputs the switching signal based on a switching of the drive state.

9. The drive circuit according to claim 1, wherein:
the second power supply has an operational amplifier, a capacitor, and a resistor that divides a reference voltage; and
the second power supply generates the output voltage by dividing the reference voltage and charging the capacitor via the operational amplifier.

10. The drive circuit according to claim 1, wherein:
the switching element is made of a wide bandgap semiconductor.

* * * * *